(12) United States Patent
Nakayama et al.

(10) Patent No.: US 10,955,745 B2
(45) Date of Patent: Mar. 23, 2021

(54) EXPOSURE DEVICE, SUBSTRATE PROCESSING APPARATUS, EXPOSURE METHOD AND SUBSTRATE PROCESSING METHOD

(71) Applicant: SCREEN HOLDINGS CO., LTD., Kyoto (JP)

(72) Inventors: Chisayo Nakayama, Kyoto (JP); Yuji Tanaka, Kyoto (JP); Masahiko Harumoto, Kyoto (JP); Masaya Asai, Kyoto (JP); Yasuhiro Fukumoto, Kyoto (JP); Koji Kaneyama, Kyoto (JP)

(73) Assignee: SCREEN Holdings Co., Ltd.

( * ) Notice: Subject to any disclaimer, the term of this patent is extended or adjusted under 35 U.S.C. 154(b) by 104 days.

(21) Appl. No.: 16/124,331

(22) Filed: Sep. 7, 2018

(65) Prior Publication Data
US 2019/0086808 A1 Mar. 21, 2019

(30) Foreign Application Priority Data

Sep. 21, 2017 (JP) .............................. JP2017-181527
Sep. 21, 2017 (JP) .............................. JP2017-181528

(51) Int. Cl.
*G03F 7/20* (2006.01)
*G03F 7/16* (2006.01)

(52) U.S. Cl.
CPC ............ *G03F 7/2002* (2013.01); *G03F 7/168* (2013.01); *G03F 7/70858* (2013.01)

(58) Field of Classification Search
CPC ............ H01L 21/0337; H01L 21/0274; H01L 21/67115; H01L 21/67225; H01L 21/67739–67751; B81C 2201/0147; B81C 2201/0149; B81C 2201/0156; B81C 2201/0159; G03F 7/2002; G03F 7/2004;
(Continued)

(56) References Cited

U.S. PATENT DOCUMENTS 5,763,892 A * 6/1998 Kizaki ................. G03F 7/16
250/492.1
6,222,610 B1 * 4/2001 Hagiwara ........... G03F 7/70858
355/30
(Continued)

FOREIGN PATENT DOCUMENTS

CN 106133882 A 11/2016
JP 2016-183990 A 10/2016

*Primary Examiner* — Christina A Riddle
(74) *Attorney, Agent, or Firm* — Ostrolenk Faber LLP

(57) ABSTRACT

Exhaust of gas in the processing chamber is started by a gas exhaust section, and supply of an inert gas into the processing chamber is started by a gas supply section after a predetermined time length has elapsed since the exhaust of gas is started. Alternatively, the gas in the processing chamber in which a substrate is stored is exhausted by the gas exhaust section, the inert gas is supplied into the processing chamber by the gas supply section, and the pressure in a light emitter that has a light-transmitting plate is allowed to match or be close to the pressure in the processing chamber. The substrate in the processing chamber is irradiated with vacuum ultraviolet rays by the light emitter with an oxygen concentration in the gas in the processing chamber lowered to a predetermined concentration. Thus, the substrate is exposed.

22 Claims, 17 Drawing Sheets

(58) Field of Classification Search
CPC .............. G03F 7/70008; G03F 7/70016; G03F 7/7005; G03F 7/70375; G03F 7/70383; G03F 7/704; G03F 7/70408; G03F 7/707; G03F 7/70716; G03F 7/70725; G03F 7/70733; G03F 7/7075; G03F 7/70758; G03F 7/70775; G03F 7/708; G03F 7/70808; G03F 7/70825; G03F 7/70841; G03F 7/70858; G03F 7/70866; G03F 7/70908; G03F 7/70916; G03F 7/70925; G03F 7/70933; G03F 7/70991; G03F 7/40; G03F 7/405; G03F 7/168; G03F 7/7055
USPC .......... 355/52, 53, 55, 67–74, 77; 250/492.1, 250/492.2, 492.22, 493.1, 494.1, 548, 250/504 R; 264/220; 427/259; 430/311
See application file for complete search history.

(56) References Cited

U.S. PATENT DOCUMENTS

| | | | |
|---|---|---|---|
| 2012/0228261 A1* | 9/2012 | Watanabe | G03F 7/40 216/41 |
| 2015/0203965 A1* | 7/2015 | Enomoto | C23C 16/4584 438/758 |
| 2016/0282725 A1* | 9/2016 | Miyagi | H01L 21/67225 |
| 2017/0148648 A1 | 5/2017 | Yoshida | |
| 2019/0361351 A1* | 11/2019 | Koga | G03F 7/40 |

* cited by examiner

F I G. 1 3 A
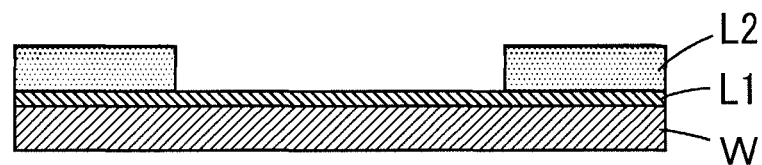
F I G. 1 3 B
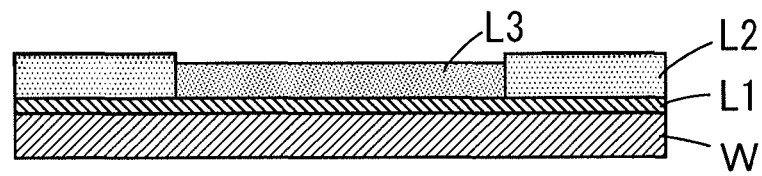
F I G. 1 3 C
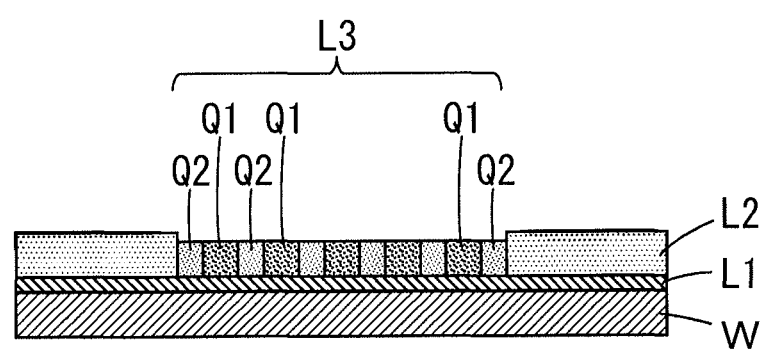
F I G. 1 3 D
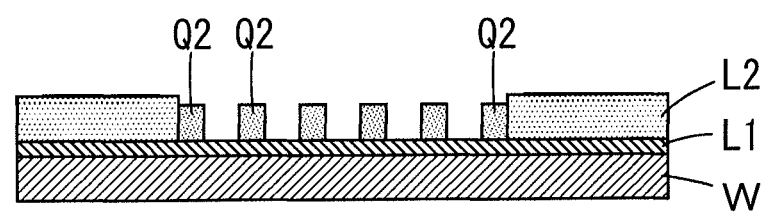

EXPOSURE DEVICE, SUBSTRATE PROCESSING APPARATUS, EXPOSURE METHOD AND SUBSTRATE PROCESSING METHOD

BACKGROUND OF THE INVENTION

Field of the Invention

The present invention relates to an exposure device, a substrate processing apparatus, an exposure method and a substrate processing method for performing exposure processing on a substrate.

Description of Related Art

In recent years, a photolithography technique utilizing Directed Self Assembly (DSA) of a block copolymer has been developed in order to realize a finer pattern formed on a substrate. In such a photolithography technique, heating processing is performed on the substrate to which a block polymer has been applied, and then one surface of the substrate is exposed. Thus, the block polymer is reformed. In this processing, it is required that radiant exposure of the substrate is accurately adjusted.

JP 2016-183990 A describes an exposure device that performs exposure processing on a film (DSA film), including a Directed Self Assembly, on a substrate. The exposure device has a light emitter that can emit vacuum ultraviolet rays having a strip-shape cross section, and is configured to be movable from a front position to a rear position of the light emitter to cross a path of the vacuum ultraviolet rays emitted by the light emitter. Before the exposure processing, irradiance of the vacuum ultraviolet rays is detected in advance by an irradiance sensor, and a movement speed of the substrate is calculated based on the detected irradiance such that the substrate is irradiated with a desired radiant exposure of the vacuum ultraviolet rays. During the exposure processing, the substrate moves at a calculated movement speed, whereby the DSA film on the substrate is irradiated with the desired radiant exposure of the vacuum ultraviolet rays.

BRIEF SUMMARY OF THE INVENTION

During the exposure processing, when oxygen is present in the path of the vacuum ultraviolet rays with which the substrate is irradiated, an oxygen molecule that receives the vacuum ultraviolet rays is separated into oxygen atoms, and a separated oxygen atom is recoupled with another oxygen molecule. Thus, ozone is generated. In this case, the vacuum ultraviolet rays that arrive at the substrate are attenuated. As such, in JP 2016-183990 A, the gas in the casing of the exposure device is exhausted such that an oxygen concentration during the exposure processing is lowered to a value equal to or lower than 1%. However, it requires a long period of time to discharge oxygen molecules, so that efficiency of the exposure processing of the substrate is degraded.

An object of the present invention is to provide an exposure device capable of improving efficiency of exposure processing of a substrate, a substrate processing apparatus in which the efficiency of the exposure processing of the substrate can be improved, and an exposure method and a substrate processing method with which the efficiency of the exposure processing of the substrate can be improved.

(1) An exposure device according to one aspect of the present invention includes a processing chamber that stores a substrate, a platform on which the substrate is placed in the processing chamber, a first gas exhaust section for exhausting gas in the processing chamber, a first gas supply section for supplying an inert gas into the processing chamber, a light emitter that emits vacuum ultraviolet rays, a first gas supply controller that controls the first gas supply section such that supply of the inert gas into the processing chamber is started after a predetermined first time length has elapsed since exhaust of the gas in the processing chamber is started by the first gas exhaust section, a light emission controller that controls the light emitter such that the substrate is exposed by irradiation of the substrate in the processing chamber with the vacuum ultraviolet rays with an oxygen concentration in the gas in the processing chamber lowered to a predetermined concentration, and a driver that moves the platform between a first position and a second position such that the platform is located at the first position in the processing chamber when the substrate is carried into or carried out from the processing chamber, and moves the platform between the first position and the second position such that the platform is located at the second position that is closer to the light emitter than the first position when the substrate is irradiated with the vacuum ultraviolet rays by the light emitter.

In this exposure device, the platform is moved to the first position in the processing chamber by the driver. In this state, the substrate is carried into the processing chamber and placed on the platform. Here, exhaust of the gas in the processing chamber is started by the first gas exhaust section. After the predetermined first time length has elapsed since the exhaust of the gas is started, the supply of the inert gas into the processing chamber is started by the first gas supply section. In this case, the gas in the processing chamber is replaced with the inert gas, and the oxygen concentration is lowered.

When the oxygen concentration in the gas in the processing chamber is lowered to the predetermined concentration, the platform is moved to the second position closer to the light emitter than the first position by the driver. Further, the substrate in the processing chamber is irradiated with the vacuum ultraviolet rays by the light emitter. Thus, the substrate is exposed with little generation of ozone. Thereafter, the platform is moved to the first position by the driver, and the substrate is carried out from the processing chamber.

With this configuration, the platform is moved to the first position, so that the substrate can be easily received and transferred between the inside and outside of the processing chamber without interfering with the light emitter. Further, when the substrate is irradiated with the vacuum ultraviolet rays by the light emitter, the platform is moved to the second position. Thus, the substrate can be efficiently exposed while being in close proximity to the light emitter.

Further, after the first time length has elapsed since the exhaust of the gas in the processing chamber is started, the supply of the inert gas into the processing chamber is started. In this case, before the supply of the inert gas, the oxygen in the processing chamber is exhausted to the outside of the processing chamber together with another gas. Thus, the pressure in the processing chamber is lowered, and an amount of oxygen is reduced. Thereafter, the inert gas is supplied into the processing chamber, and a small amount of oxygen remaining in the processing chamber is exhausted to the outside of the processing chamber together with the inert gas. Therefore, the oxygen concentration in the gas in the processing chamber is lowered in a short period of time after the substrate is carried into the processing chamber. Therefore, the exposure of the substrate can be started in a short period of time since the substrate is carried in. As a result, the efficiency of the exposure processing of the substrate can be improved.

(2) The exposure device may further include a gas exhaust controller that controls the first gas exhaust section such that the exhaust of gas in the processing chamber is stopped after a predetermined second time length has elapsed since the supply of the inert gas into the processing chamber is started by the first gas supply section.

In this case, the inert gas is further supplied into the processing chamber with the exhaust of gas in the processing chamber stopped. Thus, the oxygen concentration in the gas in the processing chamber is more sufficiently lowered, and generation of ozone can be more efficiently prevented.

(3) The light emitter may be arranged above the platform and may emit the vacuum ultraviolet rays downwardly, the second position may be below the light emitter, and the first position may be below the second position, and the driver may lift and lower the platform between the first position and the second position. In this case, the substrate can be efficiently received and transferred between the inside and outside of the processing chamber.

(4) The driver may move the platform such that the platform is located at a third position that is farther upward than the first position and farther downward than the second position when the gas in the processing chamber is exhausted by the first exhaust section. In this case, the spaces above and below the platform that is located at the third position are relatively large, so that oxygen is unlikely to be stagnant. Thus, oxygen can be more efficiently exhausted.

(5) The first gas exhaust section may have a gas exhaust port through which gas is exhausted in the processing chamber, the first gas supply section may have a gas supply port through which the inert gas is supplied in the processing chamber, the gas exhaust port may be arranged at one of a position farther upward than the third position and a position farther downward than the third position, and the gas supply port may be arranged at another one of the position farther upward than the third position and the position farther downward than the third position. In this case, flows of the inert gas are formed in spaces above and below the platform that is located at the third position. Thus, oxygen can be more efficiently exhausted.

(6) The gas exhaust port may be arranged at a position farther downward than the third position, and the gas supply port may be arranged at a position farther upward than the third position. In this case, the inert gas can be directly supplied to the space above the platform that is located at the third position. Thus, the oxygen between the platform and the light emitter can be more efficiently exhausted, and the exposure of the substrate can be started in a short period of time since the substrate is carried in.

(7) The gas exhaust port and the gas supply port may be arranged with the third position located therebetween. In this case, a flow of the inert gas extending along the space around the platform that is located at the third position is formed. Thus, oxygen can be more efficiently exhausted.

(8) The exposure device may further include a plurality of support members that extend in an up-and-down direction in the processing chamber, wherein upper ends of the plurality of support members may be higher than the first position and lower than the second position, the platform may have a plurality of through holes through which the plurality of support members can pass, and the plurality of support members may pass through the plurality of through holes of the platform when the platform is located at the first position.

In this case, the plurality of support members can support the substrate that has been carried into the processing chamber at their upper ends that are higher than the first position and lower than the second position. Therefore, the platform is lifted from the first position, so that the substrate can be easily placed on the platform. Further, the platform is lowered from the second position, so that the substrate can be supported at the upper ends of the plurality of support members. Thus, the substrate can be easily carried out from the upper ends of the plurality of support members to the outside of the processing chamber.

(9) The exposure device may further include a pressure controller that controls pressure in the light emitter such that the pressure in the light emitter matches or is close to the pressure in the processing chamber, wherein the light emitter may have a light-transmitting window member, and may emit the vacuum ultraviolet rays to the substrate in the processing chamber through the window member.

In this case, the substrate in the processing chamber is irradiated with the vacuum ultraviolet rays through the window member by the light emitter. Here, the pressure in the light emitter is controlled to match or be close to the pressure in the processing chamber. Therefore, even when the gas in the processing chamber is exhausted earlier than the supply of the gas into the processing chamber, a pressure difference between the inside of the processing chamber and the inside of the light emitter is hardly generated. Therefore, generation of stress in the window member is prevented. Thus, the useful life of the window member is prolonged. Further, because it is not necessary to increase the thickness of the window member, transmittance of the window member is improved. As a result, efficiency of the exposure processing of the substrate can be improved.

(10) The pressure controller may include a second gas exhaust section for exhausting gas in the light emitter, a second gas supply section for supplying an inert gas into the light emitter, and a second gas supply controller that controls the second gas supply section such that supply of the inert gas into the light emitter is started after the first time length has elapsed since exhaust of the gas in the light emitter is started by the second gas exhaust section. In this case, the pressure in the light emitter can be allowed to match or be close to the pressure in the processing chamber by simple control.

(11) The pressure controller may include a connector that connects an inner space of the processing chamber to an inner space of the light emitter, and a second gas supply section that supplies an inert gas into the light emitter. In this case, the pressure in the light emitter can be allowed to match or be close to the pressure in the processing chamber by simpler control.

(12) A substrate processing apparatus according to another aspect of the present invention includes a coater that forms a film on a substrate by applying a processing liquid to the substrate, a thermal processor that thermally processes the substrate on which the film is formed by the coater, the exposure device according to one aspect of the present invention that exposes the substrate that has been thermally processed by the thermal processor, and a developer that develops the film of the substrate by supplying a solvent to the substrate that has been exposed by the exposure device.

In this substrate processing apparatus, the processing liquid is applied to the substrate by the coater, so that the film is formed on the substrate. The substrate on which the film is formed by the coater is thermally processed by the thermal processor. The substrate that has been thermally processed by the thermal processor is exposed by the above-mentioned exposure device. The solvent is supplied by the developer to the substrate that has been exposed by the exposure device, whereby the film of the substrate is developed.

In the exposure device, the substrate can be easily received and transferred between the inside and outside of the processing chamber without interfering with the light emitter, and the substrate can be efficiently exposed while being in close proximity to the light emitter. Further, after the substrate is carried into the processing chamber, the oxygen concentration in the gas in the processing chamber is lowered in a short period of time. Therefore, the exposure of the substrate can be started in a short period of time since the substrate is carried in. As a result, efficiency of the exposure processing of the substrate can be improved.

(13) The processing liquid may include a Directed Self Assembly material. In this case, the substrate to which the processing liquid including the Directed Self Assembly material has been applied is thermally processed. Thus, microphase separation occurs on one surface of the substrate. Further, the substrate on which patterns of two types of polymers are formed by the microphase separation is exposed and developed. Thus, one of two types of polymers is removed, and a fine pattern can be formed.

(14) An exposure method according to yet another aspect of the present invention includes moving a platform to a first position in a processing chamber by a driver, carrying a substrate into the processing chamber and placing the substrate on the platform, starting exhaust of gas in the processing chamber by a first gas exhaust section, starting supply of an inert gas into the processing chamber by a first gas supply section after a predetermined first time length has elapsed since the exhaust of the gas in the processing chamber is started by the first gas exhaust section, moving the platform to a second position closer to a light emitter than the first position by the driver with an oxygen concentration in the gas in the processing chamber lowered to a predetermined concentration, exposing the substrate by irradiating the substrate in the processing chamber with vacuum ultraviolet rays by the light emitter, moving the platform to the first position by the driver, and carrying out the substrate from the processing chamber.

With this exposure method, the substrate can be easily received and transferred between the inside and outside of the processing chamber without interfering with the light emitter, and the substrate can be efficiently exposed while being in close proximity to the light emitter. Further, after the substrate is carried into the processing chamber, the oxygen concentration in the gas in the processing chamber is lowered in a short period of time. Therefore, the exposure of the substrate can be started in a short period of time since the substrate is carried in. As a result, the efficiency of the exposure processing of the substrate can be improved.

(15) A substrate processing method according to yet another aspect of the present invention includes forming a film on a substrate by applying a processing liquid to a surface to be processed of the substrate by a coater, thermally processing the substrate on which the film is formed by the coater by a thermal processor, the exposure method according to yet another aspect of the present invention for exposing the substrate that has been thermally processed by the thermal processor by an exposure device, and developing the film of the substrate by supplying a solvent by a developer to the surface to be processed of the substrate that has been exposed by the exposure device.

With this substrate processing method, the substrate is exposed by the vacuum ultraviolet rays after formation of the film and before development. With the exposure method, the substrate can be easily received and transferred between the inside and outside of the processing chamber without interfering with the light emitter, and the substrate can be efficiently exposed while being in close proximity to the light emitter. Further, after the substrate is carried into the processing chamber, the oxygen concentration in the gas in the processing chamber is lowered in a short period of time. Therefore, the exposure of the substrate can be started in a short period of time since the substrate is carried in. As a result, the efficiency of the exposure processing of the substrate can be improved.

(16) An exposure device according to yet another aspect of the present invention includes a processing chamber that stores a substrate, a light emitter that has a light-transmitting window member, and emits vacuum ultraviolet rays to the substrate in the processing chamber through the window member, a first gas exhaust section for exhausting gas in the processing chamber, a first gas supply section for supplying an inert gas into the processing chamber, a pressure controller that controls pressure in the light emitter such that pressure in the light emitter matches or is close to pressure in the processing chamber, and a light emission controller that controls the light emitter such that the substrate is exposed by irradiance of the substrate in the processing chamber with the vacuum ultraviolet rays with an oxygen concentration in the gas in the processing chamber lowered to a predetermined concentration.

In this exposure device, the gas in the processing chamber in which the substrate is stored is exhausted by the first exhaust section. Further, the inert gas is supplied into the processing chamber by the first gas supply section. In this case, the gas in the processing chamber is replaced with the inert gas, and the oxygen concentration is lowered. Here, the pressure in the light emitter having the light-transmitting window member is allowed to match or be close to the pressure in the processing chamber. When the oxygen concentration in the gas in the processing chamber is lowered to the predetermined concentration, the substrate in the processing chamber is irradiated with the vacuum ultraviolet rays by the light emitter through the window member. Thus, the substrate is exposed with little generation of ozone.

With this configuration, even when the pressure in the processing chamber changes due to the exhaust of the gas in the processing chamber and the supply of the inert gas into the processing chamber, the pressure in the light emitter is allowed to match or be close to the pressure in the processing chamber. Therefore, a pressure difference between the inside of the processing chamber and the inside of the light emitter is hardly generated. Therefore, generation of stress in the window member is prevented. In this case, because it is not necessary to increase the thickness of the window member, the transmittance of the window member is improved. Thus, efficiency of the exposure processing of the substrate can be improved.

(17) The exposure device may further include a first gas supply controller that controls the first gas supply section such that supply of the inert gas into the processing chamber is started after a predetermined first time length has elapsed since exhaust of gas in the processing chamber is started by the first gas exhaust section.

In this case, before the supply of the inert gas, the oxygen in the processing chamber is exhausted to the outside of the processing chamber together with another gas. Thus, the pressure in the processing chamber is lowered, and the amount of oxygen is reduced. Even in this case, the pressure in the light emitter is allowed to match or be close to the pressure in the processing chamber. Thus, generation of stress in the window member is prevented.

Further, after that, the inert gas is supplied into the processing chamber, and a small amount of oxygen remaining in the processing chamber is exhausted to the outside of the processing chamber together with the inert gas. Therefore, after the substrate is carried into the processing chamber, the oxygen concentration in the gas in the processing chamber is lowered in a short period of time. Therefore, the exposure of the substrate can be started in a short period of time since the substrate is carried in. As a result, efficiency of the exposure processing of the substrate can be improved.

(18) The pressure controller may include a second gas exhaust section for exhausting gas in the light emitter, a second gas supply section for supplying the inert gas into the light emitter, and a second gas supply controller that controls the second gas supply section such that supply of the inert gas into the light emitter is started after the first time length has elapsed since exhaust of the gas in the light emitter is started by the second gas exhaust section. In this case, the pressure in the light emitter can be allowed to match or be close to the pressure in the processing chamber with simple control.

(19) The exposure device may further include a first gas exhaust controller that controls the first gas exhaust section such that exhaust of the gas in the processing chamber is stopped after a predetermined second time length has elapsed since the supply of the inert gas into the processing chamber is started by the first gas supply section, wherein the pressure controller may further include a second gas exhaust controller that controls the second gas exhaust section such that the exhaust of the gas in the light emitter is stopped after the second time length has elapsed since the supply of the inert gas into the light emitter is started by the second gas supply section.

In this case, the inert gas is further supplied into the processing chamber with the exhaust of gas in the processing chamber stopped. Thus, the oxygen concentration in the gas in the processing chamber is more sufficiently lowered, and generation of ozone can be more efficiently prevented. Further, the pressure in the light emitter can be allowed to match or be close to the pressure in the processing chamber with simple control.

(20) The pressure controller may include a connector that connects an inner space of the processing chamber to an inner space of the light emitter, and a second gas supply section that supplies an inert gas into the light emitter. In this case, the pressure in the light emitter can be allowed to match or be close to the pressure in the processing chamber with simpler control.

(21) The exposure device may further include a first gas exhaust controller that controls the first gas exhaust section such that exhaust of the gas in the processing chamber is stopped after a predetermined second time length has elapsed since supply of the inert gas into the processing chamber is started by the first gas supply section. In this case, the inert gas is further supplied into the processing chamber with the exhaust of gas in the processing chamber stopped. Thus, the oxygen concentration in the gas in the processing chamber can be more sufficiently lowered, and generation of ozone can be more sufficiently prevented.

(22) The processing chamber may have an opening, the exposure device may further include a closing section that opens the opening when the substrate is carried into or carried out from the processing chamber and closes the opening after the substrate is carried into the processing chamber, and the pressure controller may include a valve provided at the connector, and a connection controller that controls the valve such that the valve is closed when the opening is opened, and controls the valve such that the valve is opened when the opening is closed. With this configuration, when the opening of the processing chamber is opened, the oxygen outside of the processing chamber can be easily prevented from flowing into the light emitter through the processing chamber.

(23) In the processing chamber, the exposure device may further include the platform on which the substrate is placed, and the driver that moves the platform between the first position and the second position such that the platform is located at the first position in the processing chamber when the substrate is carried into or carried out from the processing chamber, and moves the platform between the first position and the second position such that the platform is located at the second position closer to the light emitter than the first position when the substrate is irradiated with the vacuum ultraviolet rays by the light emitter.

In this case, when the platform is moved to the first position, the substrate can be easily received and transferred between the inside and outside of the processing chamber without interfering with the light emitter. Further, when the substrate is irradiated with the vacuum ultraviolet rays by the light emitter, the platform moves to the second position. Thus, the substrate can be efficiently exposed while being in close proximity to the light emitter.

(24) The light emitter may be arranged above the platform and emit the vacuum ultraviolet rays downwardly, the second position may be arranged below the light emitter, the first position may be arranged below the second position, and the driver may lift and lower the platform between the first position and the second position. In this case, the substrate can be efficiently received and transferred between the inside and the outside of the processing chamber.

(25) The exposure device may further include a plurality of support members that extend in an up-and-down direction in the processing chamber, wherein upper ends of the plurality of support members may be higher than the first position and lower than the second position, the platform may have a plurality of through holes through which the plurality of support members can pass, and the plurality of support members may pass through the plurality of through holes of the platform when the platform is located at the first position.

In this case, the plurality of support members can support the substrate that has been carried into the processing chamber at their upper ends higher than the first position and lower than the second position. Therefore, the platform is lifted from the first position, so that the substrate can be easily placed on the platform. Further, when the platform is lowered from the second position, the substrate can be supported at the upper ends of the plurality of support members. Thus, the substrate can be easily carried out from the upper ends of the plurality of support members to the outside of the processing chamber.

(26) The driver may move the platform such that the platform is located at a third position that is farther upward than the first position and farther downward than the second position when the gas in the processing chamber is exhausted by the first exhaust section. In this case, the spaces above and below the platform located at the third position are relatively large, so that oxygen is unlikely to be stagnant. Therefore, the oxygen can be efficiently exhausted.

(27) A substrate processing apparatus according to yet another aspect of the present invention includes a coater that forms a film on a substrate by applying a processing liquid to the substrate, a thermal processor that thermally processes the substrate on which the film is formed by the coater, the exposure device according to yet another aspect of the present invention that exposes the substrate that has been thermally processed by the thermal processor, and a developer that develops the film of the substrate by supplying a solvent to the substrate that has been exposed by the exposure device.

In this substrate processing apparatus, when the processing liquid is applied to the substrate by the coater, the film is formed on the substrate. The substrate on which the film is formed by the coater is thermally processed by the thermal processor. The substrate that has been thermally processed by the thermal processor is exposed by the above-mentioned exposure device. When the solvent is supplied by the developer to the substrate that has been exposed by the exposure device, the film of the substrate is developed.

In the exposure device, because the pressure in the light emitter is allowed to match or be close to the pressure in the processing chamber, a pressure difference between the inside of the processing chamber and the inside of the light emitter is hardly generated. Therefore, generation of stress in the window member is prevented. In this case, because it is not necessary to increase the thickness of the window member, the transmittance of the window member is improved. Thus, efficiency of the exposure processing of the substrate can be improved.

(28) The processing liquid may include a Self Directed Assembly material. In this case, the substrate to which the processing liquid including the Self Directed Assembly material is applied is thermally processed, whereby micro separation occurs on one surface of the substrate. Further, the substrate on which patterns of two types of polymers are formed by the microphase separation is exposed and developed. Thus, one of the two types of polymers is removed, and a fine pattern can be formed.

(29) An exposure method according to yet another aspect of the present invention includes exhausting gas in a processing chamber in which a substrate is stored by a first gas exhaust section, supplying an inert gas into the processing chamber by a first gas supply section, allowing pressure in a light emitter having a light-transmitting window member to match or be close to pressure in the processing chamber, and exposing the substrate by irradiating the substrate in the processing chamber with vacuum ultraviolet rays through the window member by the light emitter with an oxygen concentration in the gas in the processing chamber lowered to a predetermined concentration.

With this exposure method, because the pressure in the light emitter is allowed to match or be close to the pressure in the processing chamber, a pressure difference between the inside of the processing chamber and the inside of the light emitter is hardly generated. Therefore, generation of stress in the window member is prevented. In this case, it is not necessary to increase the thickness of the window member, so that the transmittance of the window member is improved. Thus, efficiency of the exposure processing of the substrate can be improved.

(30) A substrate processing method according to yet another aspect of the present invention includes forming a film on a substrate by applying a processing liquid to a surface to be processed of the substrate by a coater, thermally processing the substrate on which the film is formed by the coater by a thermal processor, the exposure method according to yet another aspect of the present invention for exposing the substrate that has been thermally processed by the thermal processor by an exposure device, and developing the film of the substrate by supplying a solvent by a developer to the surface to be processed of the substrate that has been exposed by the exposure device.

With this substrate processing method, the substrate is exposed by the vacuum ultraviolet rays after formation of the film and before development. With the exposure method, because the pressure in the light emitter is allowed to match or be close to the pressure in the processing chamber, a pressure difference between the inside of the processing chamber and the inside of the light emitter is hardly generated. Therefore, generation of stress in the window member is prevented. In this case, it is not necessary to increase the thickness of the window member, so that the transmittance of the window member is improved. Thus, efficiency of the exposure processing of the substrate can be improved.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIGS. 13A to 13D are schematic diagrams showing one example of processing of the substrate by the substrate processing apparatus of FIG. 12;

DESCRIPTION OF THE PREFERRED EMBODIMENTS

[1] First Embodiment (1) Configuration of Exposure Device

An exposure device, a substrate processing apparatus, an exposure method and a substrate processing method according to embodiments of the present invention will be described below with reference to drawings. In the following description, a substrate refers to a semiconductor substrate, a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a substrate for solar cells or the like.

Figure 1:
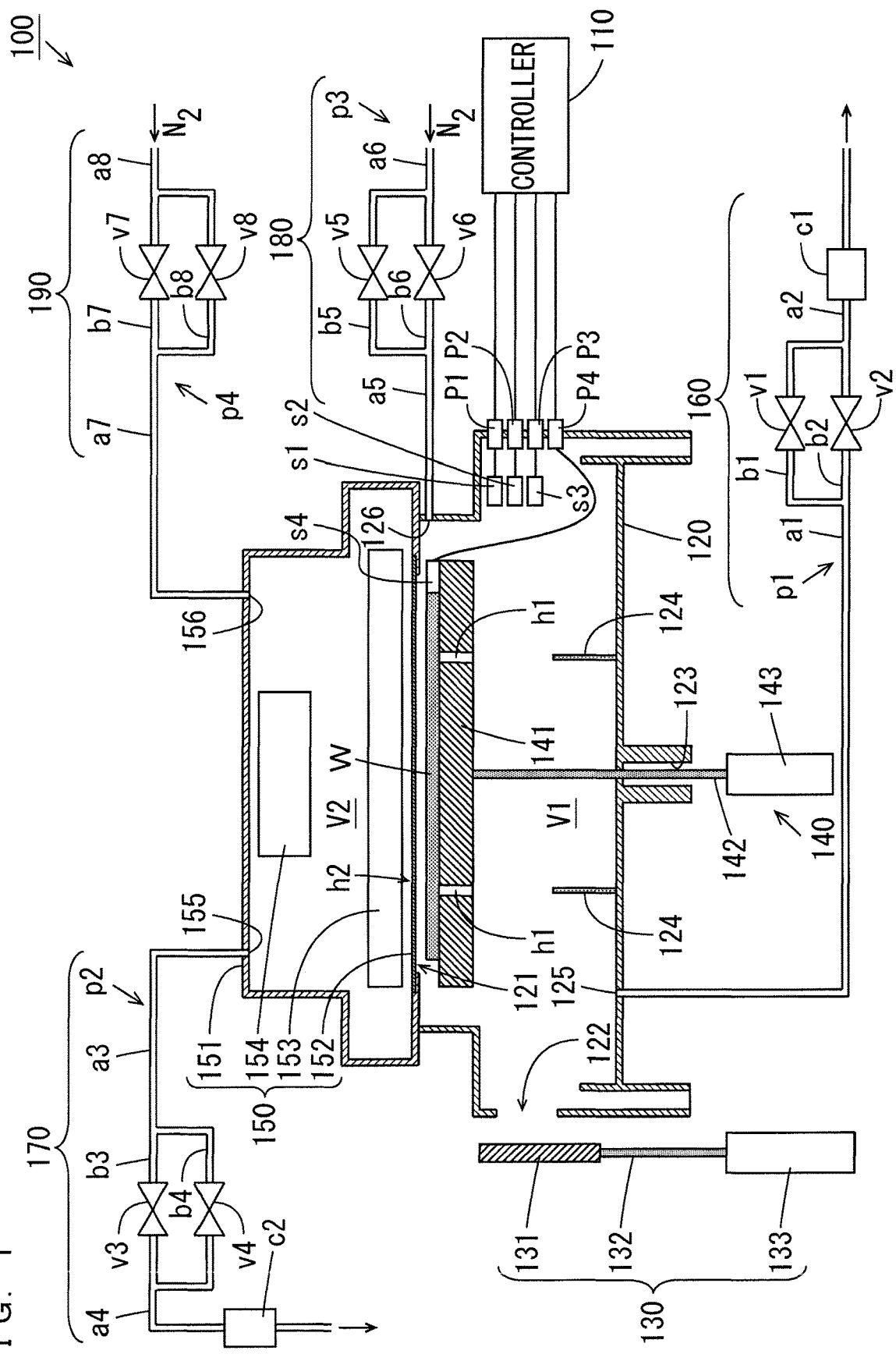
FIG. 1 is a schematic cross sectional view showing a configuration of an exposure device according to a first embodiment of the present invention.

FIG. 1 is a schematic cross sectional view showing a configuration of the exposure device according to the first embodiment of the present invention. As shown in FIG. 1, the exposure device 100 includes a controller 110, a processing chamber 120, a closing section 130, a lifter-lowerer 140, a light emitter 150, gas exhaust sections 160, 170 and gas supply sections 180, 190. The controller 110 acquires measurement values from a manometer s1, an oximeter s2, an ozone concentration meter s3 and an irradiance meter s4, described below, and controls operations of the closing section 130, the lifter-lowerer 140, the light emitter 150, the gas exhaust sections 160, 170 and the gas supply sections 180, 190. Functions of the controller 110 will be described below.

The processing chamber 120 has an upper opening 121 and an inner space V1. A housing 151 of the light emitter 150, described below, is arranged in an upper portion of the processing chamber 120, whereby the upper opening 121 of the processing chamber 120 is closed. A transport opening 122 through which a substrate W to be processed is transported between the inside and outside of the processing chamber 120 is formed in a side surface of the processing chamber 120. In the present embodiment, a film including a Directed Self Assembly material (hereinafter referred to as a DSA (Directed Self Assembly) film) is formed on the substrate W to be processed.

Further, an opening 123 through which a coupling member 142 of the lifter-lowerer 140, described below, passes is formed in a bottom surface of the processing chamber 120. A plurality (three in the present example) of support pins 124 are provided to extend upwardly from the bottom surface of the processing chamber 120 to surround the opening 123. The substrate W to be processed can be placed on upper ends of the plurality of support pins 124.

The closing section 130 includes a shutter 131, a bar-shape coupling member 132 and a driving device 133. The coupling member 132 couples the shutter 131 to the driving device 133. The driving device 133 is a stepping motor, for example. The driving device 133 moves the shutter 131 between an open position at which the shutter 131 opens the transport opening 122 and a close position at which the shutter 131 closes the transport opening 122.

A seal member is attached to the shutter 131. With the shutter 131 located at the close position, the seal member adheres to a portion surrounding the transport opening 122 in the processing chamber 120, so that the inside of the processing chamber 120 is sealed. In order to prevent friction between the seal member of the shutter 131 and the processing chamber 120, the driving device 133 moves the shutter 131 in an up-and-down direction with the shutter 131 spaced apart from the processing chamber 120 when moving the shutter 131 between the open position and the close position.

The lifter-lowerer 140 includes a flat plate-shaped placement plate 141, the bar-shape coupling member 142 and the driving device 143. The placement plate 141 is arranged in the processing chamber 120 in a horizontal attitude. A plurality of through holes h1 respectively corresponding to the plurality of support pins 124 are formed in the placement plate 141.

The coupling member 142 is arranged to extend in the up-and-down direction through the opening 123 of the processing chamber 120, and the driving device 143 is arranged below the processing chamber 120. The coupling member 142 couples the placement plate 141 to the driving device 143. A seal member is arranged between an outer peripheral surface of the coupling member 142 and an inner peripheral surface of the opening 123 such that the coupling member 142 can slide in the up-and-down direction.

The driving device 143 is a stepping motor, for example, and moves the placement plate 141 among a processing position, a waiting position and a gas exhaust position. Here, the processing position is farther upward than the upper ends of the plurality of support pins 124. The waiting position is farther downward than the upper ends of the plurality of support pins 124. The gas exhaust position is farther downward than the processing position and farther upward than the waiting position. With the placement plate 141 located at the waiting position, the plurality of support pins 124 are respectively inserted into the plurality of through holes h1. When the placement plate 141 is located at the waiting position, a lower surface of the placement plate 141 may come into contact with the bottom surface of the processing chamber 120.

The placement plate 141 is moved to the waiting position, so that the substrate W can be easily received and transferred between the inside and outside of the processing chamber 120 without interfering with the light emitter 150. Further, the placement plate 141 is moved to the processing position, so that the substrate W can be efficiently exposed while being in close proximity to the light emitter 150 when the substrate W is irradiated with the vacuum ultraviolet rays by the light emitter 150. Details of the gas exhaust position will be described below.

The light emitter 150 includes the housing 151 having a lower opening h2 and an inner space V2, a light-transmitting plate 152, a planar light source 153 and a power supply device 154. In the present embodiment, the light-transmitting plate 152 is a quartz glass plate. As a material for the light-transmitting plate 152, another material that transmits the vacuum ultraviolet rays, described below, may be used. As described above, the housing 151 is arranged in the upper portion of the processing chamber 120 to close the upper opening 121 of the processing chamber 120. The light-transmitting plate 152 is attached to the housing 151 to close the lower opening h2 of the housing 151. The inner space V1 of the processing chamber 120 and the inner space V2 of the housing 151 are separated from each other by the light-transmitting plate 152 while being optically accessible.

The light source 153 and the power supply device 154 are stored in the housing 151. In the present embodiment, the light source 153 is constituted by a plurality of bar-shape light source elements, which emit vacuum ultraviolet rays having a wavelength of about not less than 120 nm and not more than about 230 nm and are horizontally arranged at predetermined intervals. Each light source element may be a xenon excimer lamp, or may be another excimer lamp or a deuterium lamp, for example. The light source 153 emits the vacuum ultraviolet rays having substantially uniform light quantity distribution into the processing chamber 120 through the light-transmitting plate 152. An area of an emission surface of the vacuum ultraviolet rays in the light source 153 is larger than an area of the surface to be processed of the substrate W. The power supply device 154 supplies electric power to the light source 153.

The gas exhaust section 160 includes a pipe p1, valves v1, v2 and a suction device c1. The pipe p1 includes main pipes a1, a2 and branch pipes b1, b2. The branch pipes b1, b2 are arranged between the main pipes a1, a2 in parallel with each other to branch into two flow paths. The flow path of the branch pipe b1 is larger than the flow path of the branch pipe b2. The valves v1, v2 are provided at the branch pipes b1, b2, respectively.

The main pipe a1 is connected to a gas exhaust port 125 of the processing chamber 120. Here, the gas exhaust port 125 of the processing chamber 120 is formed at a position farther downward than the gas exhaust position. The main pipe a2 is connected to a gas exhaust system. The suction device c1 is provided at the main pipe a2. The suction device c1 is an ejector, for example. The suction device c1 exhausts the gas in the processing chamber 120 through the pipe p1. The valves v1, v2 are opened or closed, so that a flow rate of the gas to be exhausted is adjusted. The gas exhausted by the suction device c1 is detoxified by the gas exhaust system.

The gas exhaust section 170 includes a pipe p2, valves v3, v4 and a suction device c2. The pipe p2 includes main pipes a3, a4 and branch pipes b3, b4. The branch pipes b3, b4 are arranged between the main pipes a3, a4 in parallel with each other to branch into two flow paths. The flow path of the branch pipe b3 is larger than the flow path of the branch pipe b4. The valves v3, v4 are provided at the branch pipes b3, b4, respectively.

The main pipe a3 is connected to a gas exhaust port 155 of the housing 151. The main pipe a4 is connected to the above-mentioned gas exhaust system. The suction device c2 is provided at the main pipe a4. The suction device c2 exhausts the gas in the housing 151 through the pipe p2. The valves v3, v4 are opened or closed, so that a flow rate of the gas to be exhausted is adjusted. The gas exhausted by the suction device c2 is detoxified by the gas exhaust system.

The gas supply section 180 includes a pipe p3 and two valves v5, v6. The pipe p3 includes main pipes a5, a6 and branch pipes b5, b6. The branch pipes b5, b6 are arranged between the main pipe a5 and the main pipe a6 in parallel with each other to branch into two flow paths. The flow path of the branch pipe b5 is larger than the flow path of the branch pipe b6. The valves v5, v6 are provided at the branch pipes b5, b6, respectively.

The main pipe a5 is connected to a gas supply port 126 of the processing chamber 120. Here, the gas supply port 126 of the processing chamber 120 is formed at a position farther upward than the gas exhaust position. The main pipe a6 is connected to an inert gas supply source. An inert gas is supplied from the inert gas supply source into the processing chamber 120 through the pipe p3. The valves v5, v6 are opened or closed, so that a flow rate of the inert gas to be supplied into the processing chamber 120 is adjusted. In the present embodiment, a nitrogen gas is used as the inert gas.

The gas supply section 190 includes a pipe p4 and two valves v7, v8. The pipe p4 includes main pipes a7, a8 and branch pipes b7, b8. The branch pipes b7, b8 are arranged between the main pipe a7 and the main pipe a8 in parallel with each other to branch into the two flow paths. The flow path of the branch pipe b7 is larger than the flow path of the branch pipe b8. The valves v7, v8 are provided at the branch pipes b7, b8, respectively.

The main pipe a7 is connected to a gas supply port 156 of the housing 151. The main pipe a8 is connected to the above-mentioned inert gas supply source. The inert gas is supplied from the inert gas supply source into the housing 151 through the pipe p4. The valves v7, v8 are opened or closed, so that a flow rate of the inert gas to be supplied into the housing 151 is adjusted.

The manometer s1, the oximeter s2, the ozone concentration meter s3 and the irradiance meter s4 are provided in the processing chamber 120. The manometer s1, the oximeter s2, the ozone concentration meter s3 and the irradiance meter s4 are respectively connected to the controller 110 via connection ports P1, P2, P3, P4 provided in the processing chamber 120. The manometer s1 measures the pressure in the processing chamber 120. The oximeter s2 is a galvanic cell type oxygen sensor or a zirconia oxygen sensor, for example, and measures the oxygen concentration in the gas in the processing chamber 120.

The ozone concentration meter s3 measures the ozone concentration in the gas in the processing chamber 120. The irradiance meter s4 includes a light receiving element such as a photodiode, and measures the irradiance of the vacuum ultraviolet rays from the light source 153 with which the light receiving surface of the light receiving element is irradiated. Here, the irradiance is a work rate of vacuum ultraviolet rays with which a unit area of the light receiving surface is irradiated. A unit of irradiance is represented by "$W/m^2$", for example.

(2) Schematic Operation of Exposure Device

In the exposure device 100, substrates W are sequentially carried into the processing chamber 120, and the substrates W are irradiated with the vacuum ultraviolet rays from the light source 153 through the light-transmitting plate 152. Thus, the exposure processing is performed. However, when the oxygen concentration in the gas in the processing chamber 120 and the oxygen concentration in the gas in the housing 151 are high, an oxygen molecule absorbs the vacuum ultraviolet rays and is separated into oxygen atoms, and the separated oxygen atom is recoupled with another oxygen molecule. Thus, ozone is generated. In this case, the vacuum ultraviolet rays that arrive at the substrate W attenuate. The attenuation of the vacuum ultraviolet rays is larger than the attenuation of ultraviolet rays having a wavelength larger than about 230 nm.

As such, in the exposure processing, the gas in the processing chamber 120 is replaced with the inert gas by the gas exhaust section 160 and the gas supply section 180. Further, the gas in the housing 151 is replaced with the inert gas by the gas exhaust section 170 and the gas supply section 190. Thus, the oxygen concentration in the gas in the processing chamber 120 and the oxygen concentration in the gas in the housing 151 are lowered. When the oxygen concentration measured by the oximeter s2 is lowered to a predetermined concentration (100 ppm, for example), the substrate W is irradiated with the vacuum ultraviolet ray by the light source 153.

When the radiant exposure of the vacuum ultraviolet rays with which the substrate W is irradiated reaches a predetermined set radiant exposure, the irradiation with the vacuum ultraviolet rays is stopped, and the exposure ends. Here, the radiant exposure is the energy of the vacuum ultraviolet rays with which a unit area of the surface to be processed of the substrate W is irradiated during the exposure processing. The unit of the radiant exposure is represented by "$J/m^2$", for example. Therefore, the radiant exposure of the vacuum ultraviolet rays is acquired by integration of irradiance of the vacuum ultraviolet rays measured by the irradiance meter s4.

In the exposure device 100, the housing 151 is hermetically sealed except for the time of maintenance, so that the atmosphere of the inert gas in the housing 151 can always be maintained. In contrast, as for the processing chamber 120, every time the substrate W is carried in and carried out, the transport opening 122 is opened, and the hermetic state is released. Therefore, the atmosphere of the inert gas in the processing chamber 120 cannot always be maintained, and it is necessary to replace the gas in the processing chamber 120 with the inert gas every time the exposure processing is performed on each substrate W. In the case where a long period of time is required to carry out this replacement, efficiency of the exposure processing of the substrate W is reduced.

In the present embodiment, when the gas in the processing chamber 120 is replaced with the inert gas, the gas in the processing chamber 120 is exhausted by the gas exhaust section 160. The oxygen concentration is lowered to a value equal to or smaller than a certain value by the exhaust of gas for a certain period of time, and then the inert gas is supplied into the processing chamber 120 by the gas supply section 180 while the exhaust of gas is continued.

In this case, the oxygen in the processing chamber 120 is exhausted together with another gas before the supply of the inert gas. Thus, the pressure in the processing chamber 120 is lowered, and an amount of oxygen in the processing chamber 120 is reduced in a short period of time. Thereafter, the inert gas is supplied into the processing chamber 120, and a small amount of oxygen remaining in the processing chamber 120 is exhausted together with the inert gas. Therefore, the oxygen concentration in the gas in the processing chamber 120 can be lowered in a short period of time.

Figure 2:
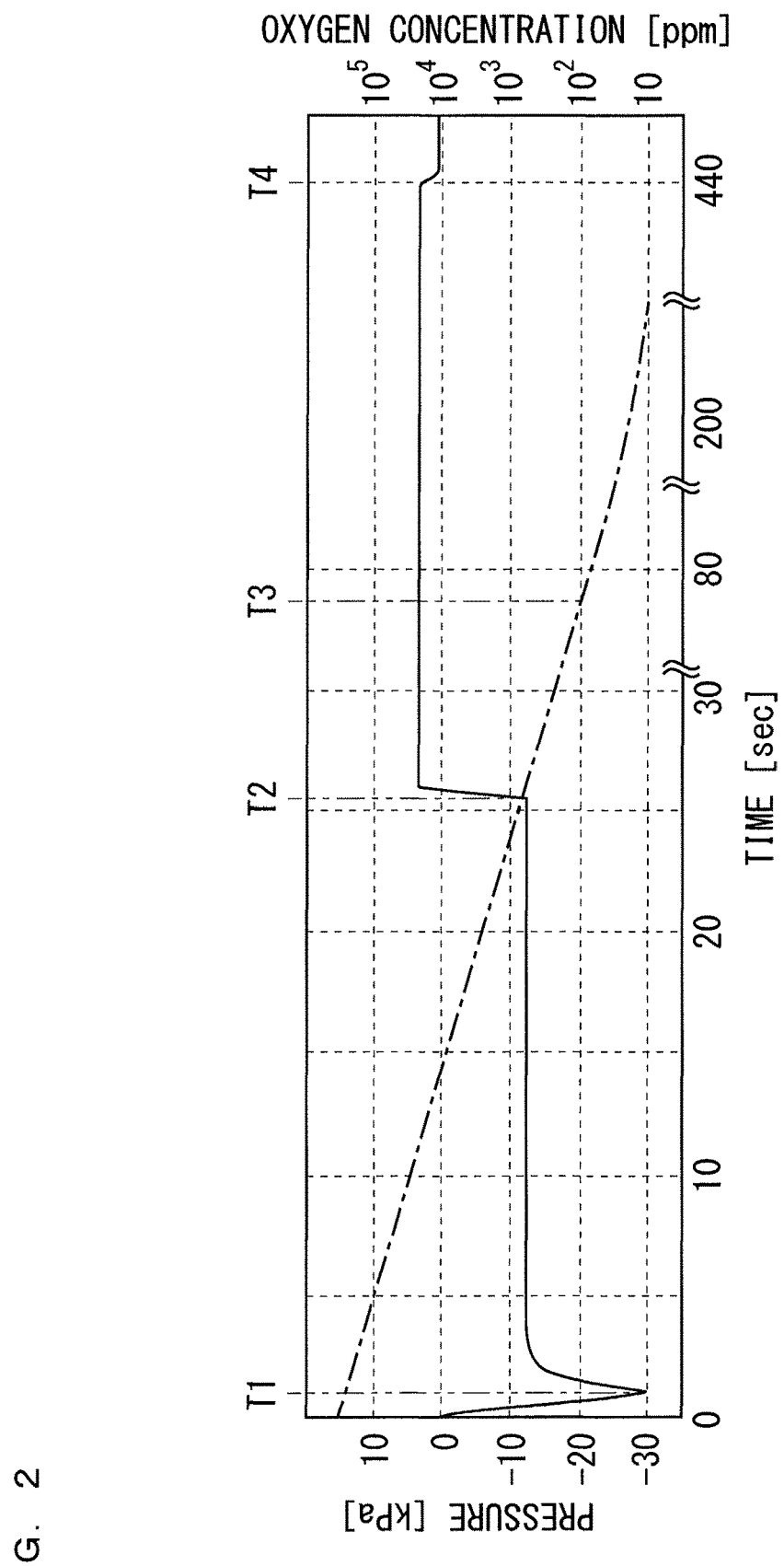
FIG. 2 is a schematic diagram showing changes of pressure and an oxygen concentration in a processing chamber.

FIG. 2 is a schematic diagram showing the changes of the pressure and the oxygen concentration in the processing chamber 120. In FIG. 2, the abscissa indicates the time, and the ordinates indicate the pressure and the oxygen concentration in the processing chamber 120. Further, the change of the pressure (an amount of difference from the atmospheric pressure) is indicated by a solid line, and the change of the oxygen concentration is indicated by a one-dot and dash line. As shown in FIG. 2, the inside of the processing chamber 120 is maintained at the atmospheric pressure at an initial time point. Further, the oxygen concentration in the gas in the processing chamber 120 is about $2 \times 10^5$ ppm.

First, the placement plate 141 is moved to the gas exhaust position, and the valve v1 of the gas exhaust section 160 is opened. Thus, the gas in the processing chamber 120 is exhausted, and the pressure in the processing chamber 120 is lowered to a value lower than the atmospheric pressure by about 30 kPa as shown in FIG. 2 (a time point T1). Next, the valve v5 of the gas supply section 180 is opened at the time point T1. Therefore, the inert gas is supplied into the processing chamber 120, and the pressure in the processing chamber 120 increases to a value lower than the atmospheric pressure by about 10 kPa while the oxygen concentration in the gas in the processing chamber 120 is lowered.

Subsequently, at a time point T2, the valve v1 of the gas exhaust section 160 is closed. Thus, the exhaust of the gas in the processing chamber 120 is stopped, and the pressure in the processing chamber 120 increases to a value higher than the atmospheric pressure by several kPa while the oxygen concentration in the gas in the processing chamber 120 is further lowered. Thereafter, at a time point T3, the oxygen concentration in the gas in the processing chamber 120 is lowered to 100 ppm. In this case, the placement plate 141 is moved to the processing position. At this time, as described below, the substrate W is in close proximity to the light-transmitting plate 152 while being placed on the placement plate 141. Here, the substrate W is irradiated with the vacuum ultraviolet rays through the light-transmitting plate 152 by the light source 153.

At a time point T4, the radiant exposure of the vacuum ultraviolet rays with which the substrate W is irradiated reaches the set radiant exposure. Thus, the emission of the vacuum ultraviolet rays from the light source 153 is stopped, and the placement plate 141 is moved to the waiting position. Further, the transport opening 122 is opened, so that the pressure in the processing chamber 120 returns to the atmospheric pressure.

With the above-mentioned procedure of the replacement, the gas in the processing chamber 120 can be highly efficiently replaced with the inert gas. However, because the pressure in the processing chamber 120 becomes lower than the pressure in the housing 151 for a certain period of time, stress is generated in the light-transmitting plate 152 provided between the processing chamber 120 and the housing 151 due to a pressure difference. In this case, the useful life of the light-transmitting plate 152 is shortened.

In the present embodiment, when the gas in the processing chamber 120 is replaced with the inert gas, the pressure in the housing 151 is controlled such that the pressure in the processing chamber 120 matches the pressure in the housing 151, or is controlled such that the pressure difference is smaller than a certain value. In this case, generation of stress in the light-transmitting plate 152 is prevented. Thus, the useful life of the light-transmitting plate 152 can be prolonged. Further, it is not necessary to increase the thickness of the light-transmitting plate 152, so that the transmittance of the light-transmitting plate 152 is improved. As a result, the efficiency of the exposure processing of the substrate W can be improved.

(3) Controller

Figure 3:
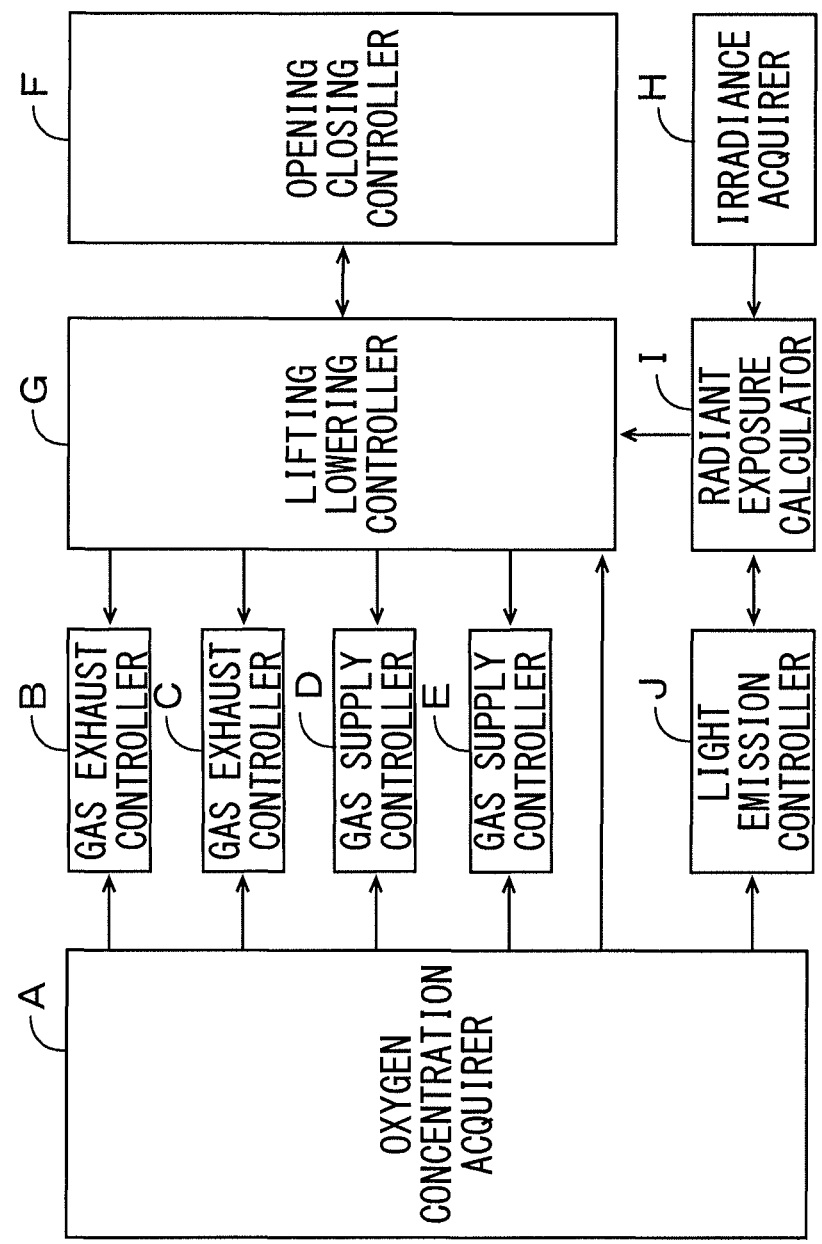
FIG. 3 is a functional block diagram showing a configuration of a controller of FIG. 1.

FIG. 3 is a functional block diagram showing a configuration of the controller 110 of FIG. 1. As shown in FIG. 3, the controller 110 includes an oxygen concentration acquirer A, gas exhaust controllers B, C, gas supply controllers D, E, an opening closing controller F, a lifting lowering controller G, an irradiance acquirer H, a radiant exposure calculator I and a light emission controller J. The controller 110 is constituted by a CPU (Central Processing Unit) and a memory, for example. In the memory of the controller 110, a control program is stored in advance. The CPU of the controller 110 executes the control program stored in the memory, whereby functions of various parts of the controller 110 are implemented.

The oxygen concentration acquirer A acquires the oxygen concentration in the gas in the processing chamber 120 based on a measurement value of the oximeter s2 of FIG. 1. As described above, in the present embodiment, because the gas in the processing chamber 120 is exhausted for a certain period of time before the supply of the inert gas, the pressure in the processing chamber 120 becomes lower than the atmospheric pressure. In this state, when the oxygen concentration cannot be measured by the oximeter s2, the oxygen concentration acquirer A may acquire the oxygen concentration in the gas in the processing chamber 120 not based on the measurement value of the oximeter s2 but based on the measurement value of the manometer s1 of FIG. 1.

The gas exhaust controller B controls the operations of the valves v1, v2 of the gas exhaust section 160 of FIG. 1. The gas exhaust controller C controls the operations of the valves v3, v4 of the gas exhaust section 170 of FIG. 1. The gas supply controller D controls the operations of the valves v5, v6 of the gas supply section 180 of FIG. 1. The gas supply controller E controls the operations of the valves v7, v8 of the gas supply section 190 of FIG. 1. The opening closing controller F controls the operation of the driving device 133 such that the shutter 131 of FIG. 1 is moved between the close position and the open position. The lifting lowering controller G controls the operation of the driving device 143 such that the placement plate 141 of FIG. 1 is moved among the waiting position, the gas exhaust position and the processing position.

The irradiance acquirer H acquires a value of irradiance of the vacuum ultraviolet rays measured by the irradiance meter s4 of FIG. 1. The radiant exposure calculator I calculates the radiant exposure of the vacuum ultraviolet rays with which the substrate W is irradiated based on the irradiance of the vacuum ultraviolet rays acquired by the irradiance acquirer H and an emission time length during which the vacuum ultraviolet rays are emitted by the light source 153 of FIG. 1.

The light emission controller J controls the operation of the power supply device 154 of FIG. 1 based on the oxygen concentration acquired by the oxygen concentration acquirer A and the radiant exposure calculated by the radiant exposure calculator I such that the light source 153 switches between emitting the vacuum ultraviolet rays and stopping emission of the vacuum ultraviolet rays. In the following description, the state where the light source 153 emits the vacuum ultraviolet rays is referred to as an emission state, and the state where the light source 153 stops emitting the vacuum ultraviolet rays is referred to as a stop state.

FIGS. 4 to 9 are diagrams for explaining the control of each part of the exposure device 100 by the controller 110 of FIG. 3. In FIGS. 4 to 9, parts of the constituent elements are not shown in order to facilitate understanding of the configurations of the inside of the processing chamber 120 and the inside of the housing 151, and the outlines of the processing chamber 120 and the housing 151 are indicated by one-dot and dash lines. Further, flows of a small amount of the inert gas to be supplied or exhausted, or flows of a small amount of gas to be supplied or exhausted are indicated by thin arrows. Flows of a large amount of the inert gas to be supplied or exhausted, or flows of a large amount of gas to be supplied or exhausted are indicated by thick arrows.

Figure 10:
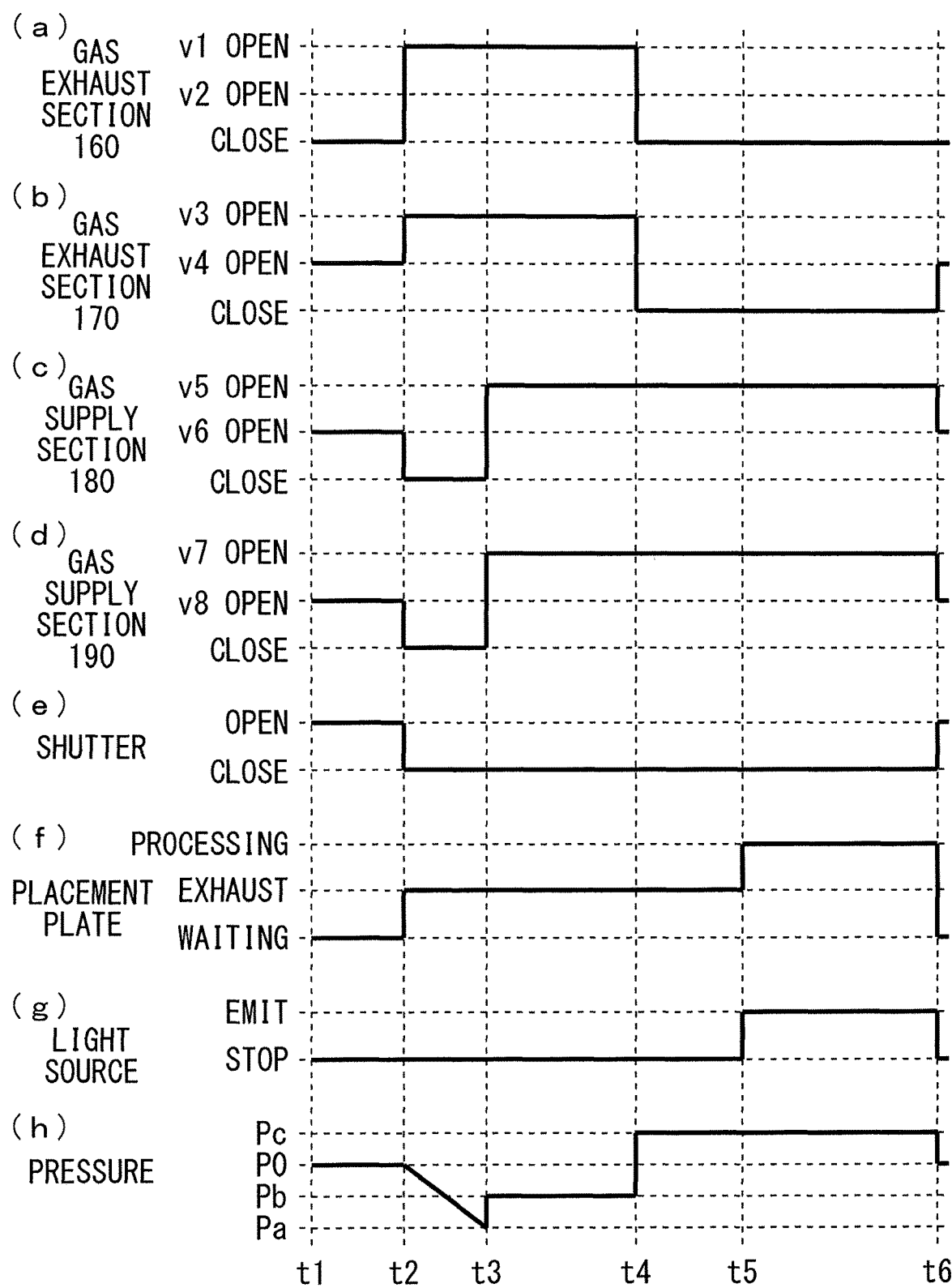
FIG. 10(a) to (h) is a diagram showing timing for controlling by the controller of FIG. 3.

FIG. 10 is a diagram showing timing for controlling by the controller 110 of FIG. 3. FIG. 10(a) to (d) shows timing for switching operations of the valves v1 to v8 in the gas exhaust section 160, the gas exhaust section 170, the gas supply section 180 and the gas supply section 190. Here, each of the "v1 OPEN" to "v8 OPEN" of FIG. 10(a) to (d) means that each of the valves v1 to v8 is opened. Each "CLOSE" of FIG. 10(a) to (d) means that each of a set of the valves v1, v2, a set of the valves v3, v4, a set of the valves v5, v6 and a set of the valves v7, v8 is closed.

FIG. 10(e) shows the time points at which the shutter 131 moves between the open position and close position. FIG. 10(f) shows the time points at which the platform plate 141 moves among the waiting position, the gas exhaust position and the processing position of the placement plate 141. FIG. 10(g) shows the timing for switching the light source 153 between the emission state and the stop state. FIG. 10(h) shows a schematic change of the pressure in the processing chamber 120 and the pressure in the housing 151. The change of the pressure in the processing chamber 120 and the change of the pressure in the housing 151 are substantially the same.

The exposure processing by the controller 110 will be described below with reference to FIGS. 4 to 10. The pressure and the oxygen concentration in the processing chamber 120 are respectively measured by the manometer s1 and the oximeter s2 of FIG. 1 at all times or regularly. Thus, the oxygen concentration in the gas in the processing chamber 120 is acquired by the oxygen concentration acquirer A of FIG. 3 at all times or regularly.

Figure 4:
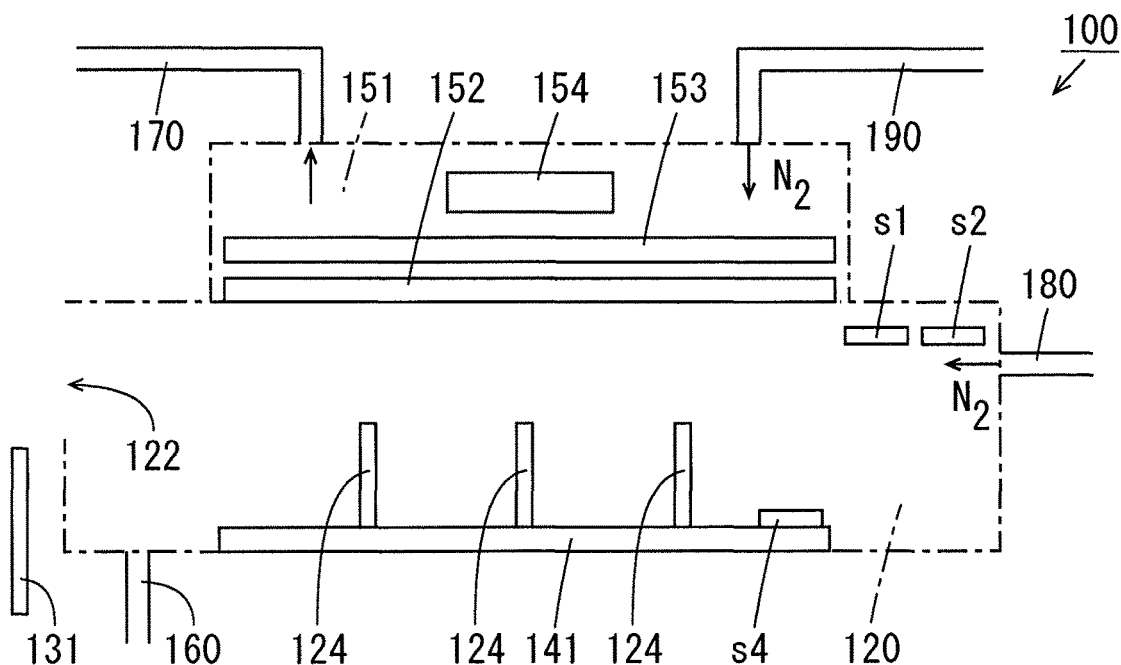
FIGS. 4 to 9 are diagrams for explaining the control of each part of the exposure device by the controller of FIG. 3.

As shown in FIG. 4, as the initial state, the shutter 131 is located at the open position, the placement plate 141 is located at the waiting position and the light source 153 is located at the stop position at the time point t1. Thus, the substrate W to be processed can be placed on the upper ends of the plurality of support pins 124 through the transport opening 122. In this state, the valves v1, v2 of the gas exhaust section 160 are closed, the valve v6 of the gas supply section 180 is opened, the valve v4 of the gas exhaust section 170 is opened, and the valve v8 of the gas supply section 190 is opened.

In this case, a small amount of the inert gas is supplied into the processing chamber 120 by the gas supply section 180. However, because the transport opening 122 is opened, the inside of the processing chamber 120 is maintained at the atmospheric pressure P0, and the oxygen concentration in the gas in the processing chamber 120 is equal to the oxygen concentration in the atmosphere. Further, a small amount of the inert gas is supplied into the housing 151 by the gas supply section 190, and a small amount of gas in the housing 151 is exhausted by the gas exhaust section 170. Thus, the housing 151 is maintained at the atmospheric pressure P0, and the inert gas in the housing 151 is maintained.

Figure 5:
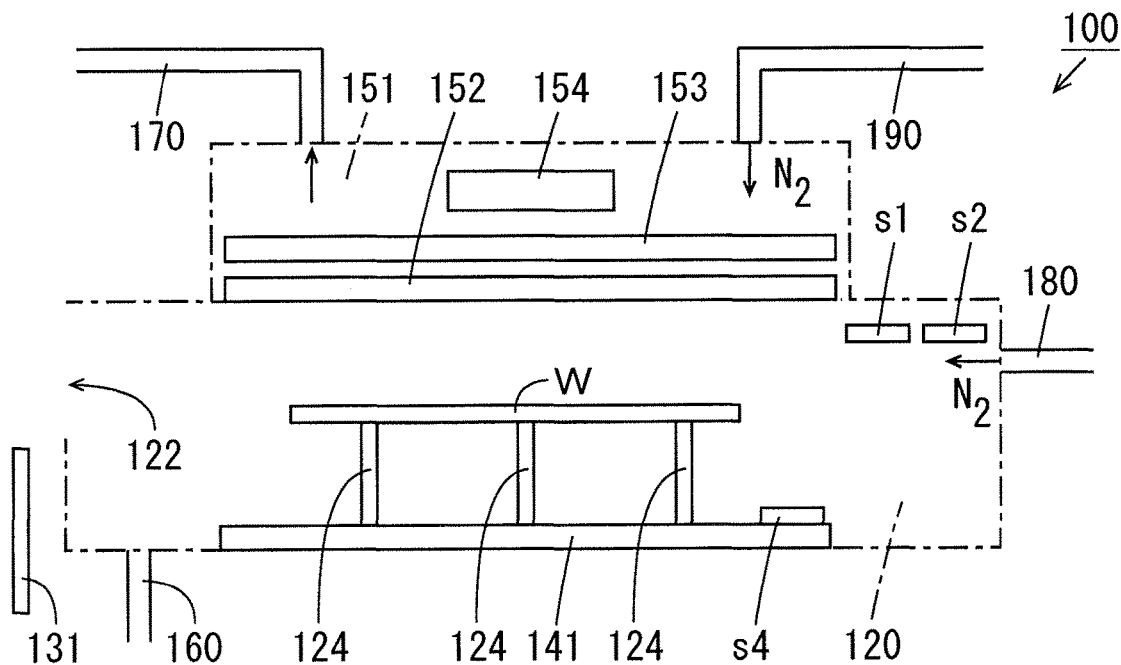
Figure 6:
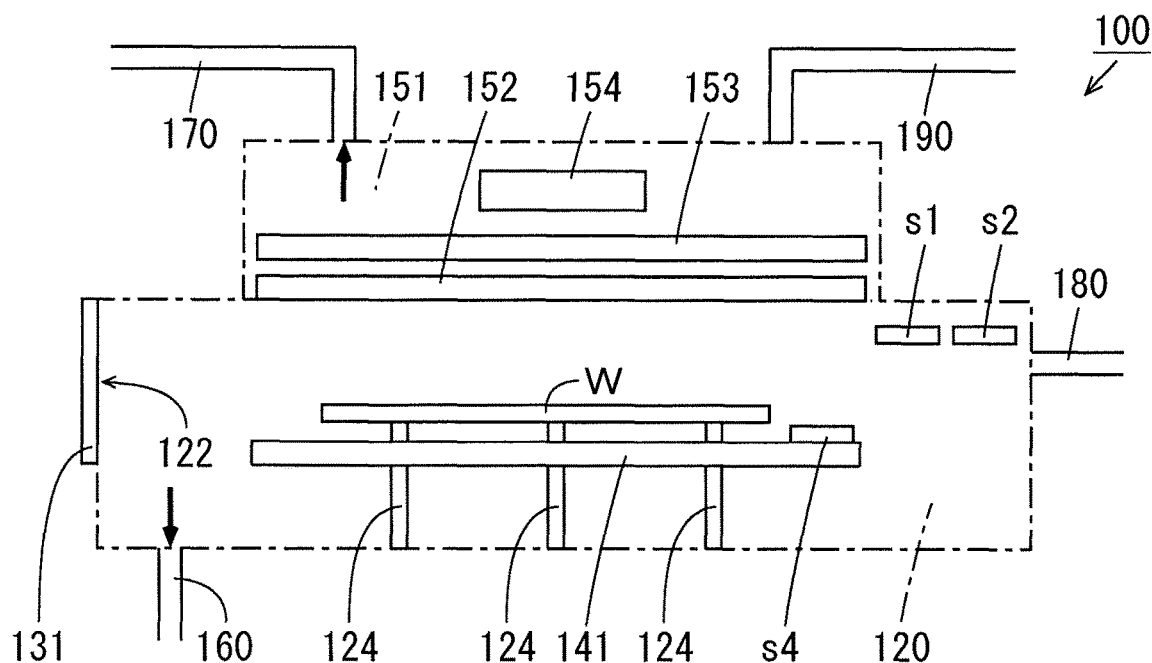

Then, as shown in FIG. 5, the substrate W is placed on the upper ends of the plurality of support pins 124 by the transport device 220 of FIG. 12, described below. Thereafter, at the time point t2, the shutter 131 is moved to the close position, and the placement plate 141 is moved to the gas exhaust position as shown in FIG. 6. Further, the valve v1 of the gas exhaust section 160 is opened, the valves v5, v6 of the gas supply section 180 are closed, the valve v3 of the gas exhaust section 170 is opened, and the valves v7, v8 of the gas supply section 190 are closed.

In this case, with the transport opening 122 closed and with the supply of the inert gas from the gas supply section 180 to the processing chamber 120 stopped, a large amount of gas in the processing chamber 120 is exhausted by the gas exhaust section 160. Therefore, the oxygen in the processing chamber 120 is exhausted to the outside of the processing chamber 120 together with another gas, whereby an amount of oxygen is reduced in a short period of time. Further, a large amount of gas in the housing 151 is exhausted by the gas exhaust section 170. Thus, the pressure in the processing chamber 120 and the pressure in the housing 151 are lowered to a value Pa lower than the atmospheric pressure P0.

After the placement plate 141 is moved to the gas exhaust position, a small clearance is prevented from being formed between the placement plate 141 and the bottom surface of the processing chamber 120, and a small clearance is prevented from being formed between the placement plate 141 and the light-transmitting plate 152. In this manner, the spaces above and below the placement plate 141 that is located at the gas exhaust position are relatively large, so that oxygen is unlikely to be stagnant. Therefore, oxygen can be efficiently exhausted. While the substrate W is not placed on the placement plate 141 that is located at the gas exhaust position in the example of FIG. 6, the present invention is not limit to this. The substrate W may be placed on the placement plate 141 that is located at the gas exhaust position.

Further, in the present embodiment, a gas exhaust port (the portion connected to the gas exhaust port 125 of the processing chamber 120 of FIG. 1) of the main pipe a1 of the gas exhaust section 160 is arranged at a position farther downward than the gas exhaust position. Further, a gas supply port (the portion connected to the gas supply port 126 of the processing chamber 120 of FIG. 1) of the main pipe a5 in the gas supply section 180 is arranged at a position farther upward than the gas exhaust position. Here, the gas exhaust port of the main pipe a1 and the gas supply port of the main pipe a5 are preferably arranged with the gas exhaust position located therebetween as described in the present embodiment.

In this arrangement, the inert gas is directly supplied to the space above the placement plate 141 that is located at the gas exhaust position. Further, a flow of the inert gas is formed to extend along the space around the placement plate 141 that is located at the gas exhaust position. Thus, the oxygen can be efficiently exhausted, and the oxygen between the placement plate 141 and the light emitter 150 can be efficiently exhausted. As a result, the exposure of the substrate W can be started in a short period of time.

Figure 7:
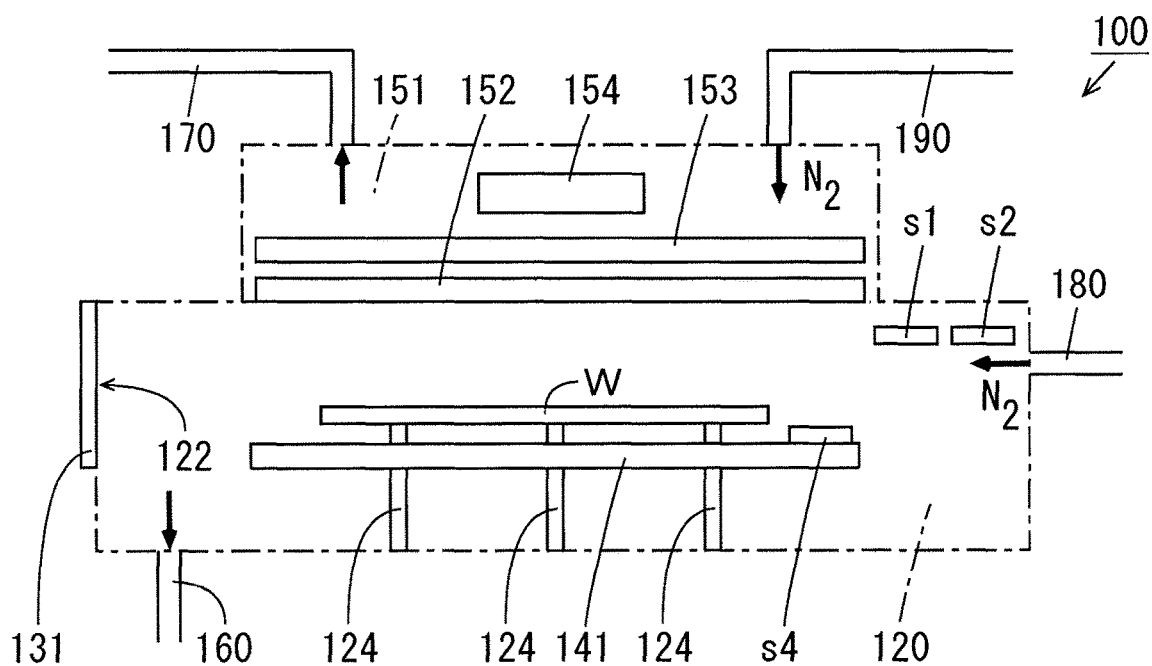

After a certain period of time has elapsed, the valve v5 of the gas supply section 180 is opened, and the valve v7 of the gas supply section 190 is opened, at the time point t3 as shown in FIG. 7. In this case, a large amount of the inert gas is supplied into the processing chamber 120 by the gas supply section 180. Therefore, a small amount of oxygen remaining in the processing chamber 120 is exhausted to the outside of the processing chamber 120 together with the inert gas. Therefore, the oxygen concentration in the gas in the processing chamber 120 is lowered in a short period of time. Further, a large amount of the inert gas is supplied into the housing 151 by the gas supply section 190. Thus, the pressure in the processing chamber 120 and the pressure in the housing 151 increase to a value Pb that is higher than the value Pa and lower than the atmospheric pressure P0.

Figure 8:
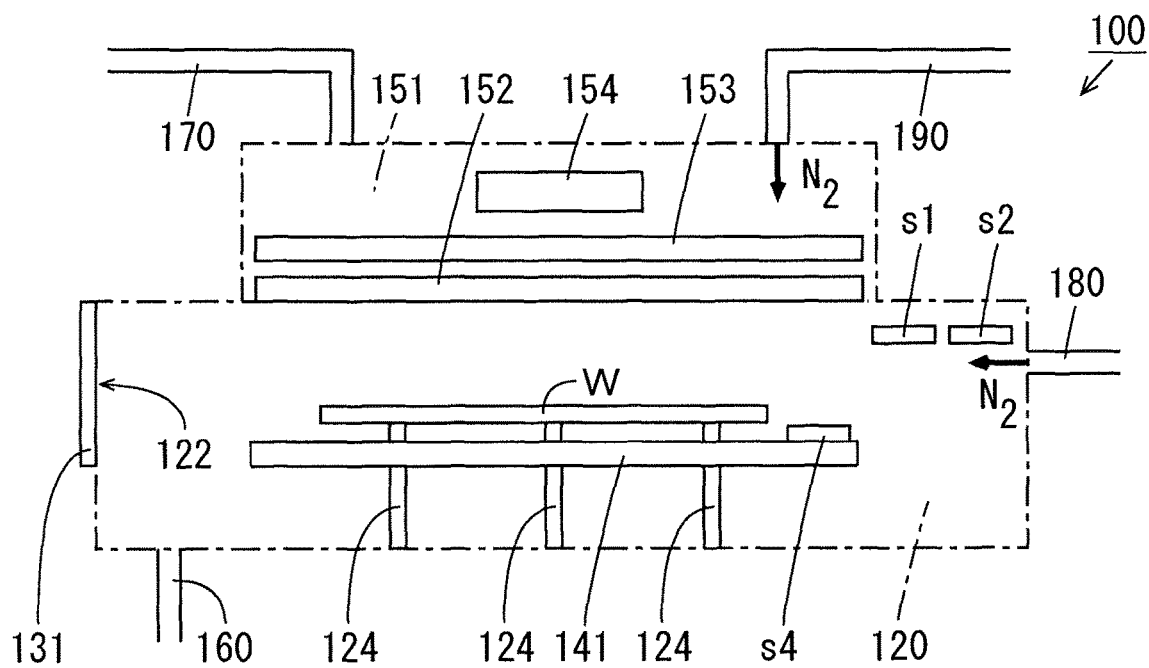

Subsequently, at a time point t4, the valves v1, v2 of the gas exhaust section 160 are closed, and the valves v3, v4 of the gas exhaust section 170 are closed, as shown in FIG. 8. In this case, a larger amount of the inert gas is supplied into the processing chamber 120 by the gas supply section 180, and a larger amount of the inert gas is supplied into the housing 151 by the gas supply section 190. Thus, the pressure in the processing chamber 120 and the pressure in the housing 151 increase to a value Pc that is higher than the atmospheric pressure P0, and the oxygen concentration in the gas in the processing chamber 120 is continuously lowered.

Figure 9:
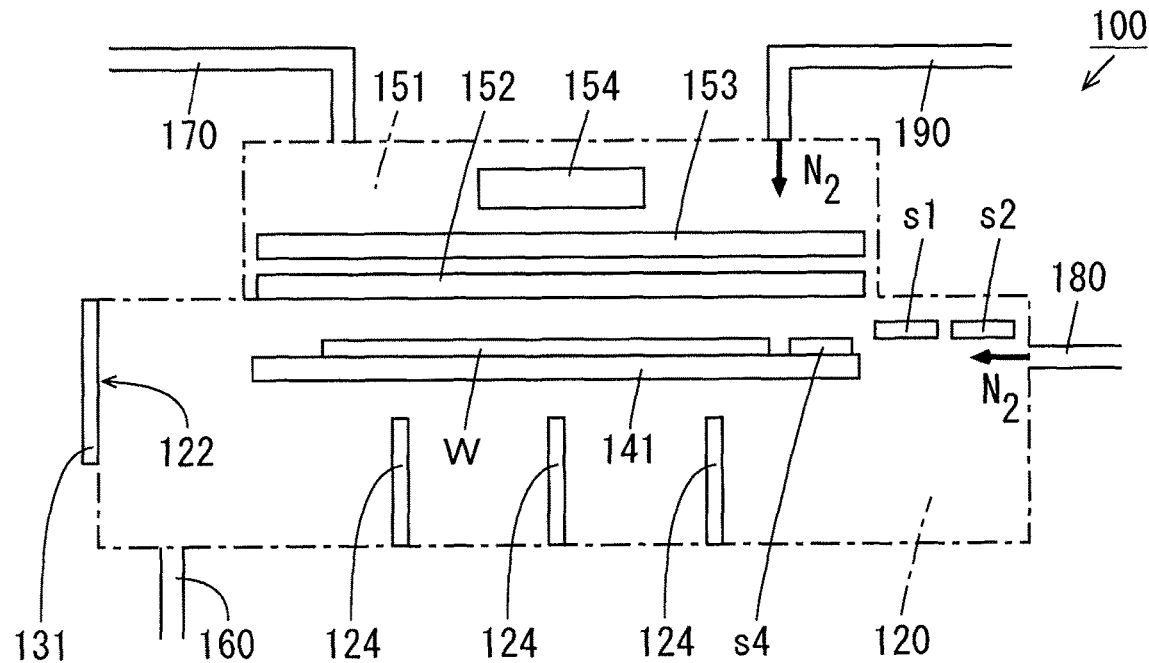

At a time point t5, the oxygen concentration in the gas in the processing chamber 120 is lowered to a value equal to or lower than the certain value (100 ppm, for example). Thus, as shown in FIG. 9, the placement plate 141 is moved to the processing position, and the light source 153 is in the emission state. In this case, the substrate W is received from the plurality of support pins 124 to be transferred to the placement plate 141 and is in close proximity to the light-transmitting plate 152. In this state, the substrate W is irradiated with the vacuum ultraviolet rays through the light-transmitting plate 152 by the light source 153, and the DSA film formed on the surface to be processed is exposed.

At a time point t6, the radiant exposure of the vacuum ultraviolet rays with which the substrate W is irradiated reaches the set radiant exposure. Thus, similarly to the initial state of FIG. 5, the light source 153 is in the stop state, the placement plate 141 is moved to the waiting position, and the shutter 131 is moved to the open position. Further, the valve v6 of the gas supply section 180 is opened, the valve v4 of the gas exhaust section 170 is opened, and the valve v8 of the gas supply section 190 is opened.

In this case, the pressure in the processing chamber 120 and the pressure in the housing 151 are maintained at the atmospheric pressure P0, and the oxygen concentration in the gas in the processing chamber 120 becomes equal to the oxygen concentration in the atmosphere. Further, the substrate W is received after exposure from the placement plate 141 to be transferred to the plurality of support pins 124. In the present example, the substrate W is transported from the upper ends of the plurality of support pins 124 to the outside of the processing chamber 120 by the transport device 220 of FIG. 12, described below.

(4) Exposure Processing

Figure 11:
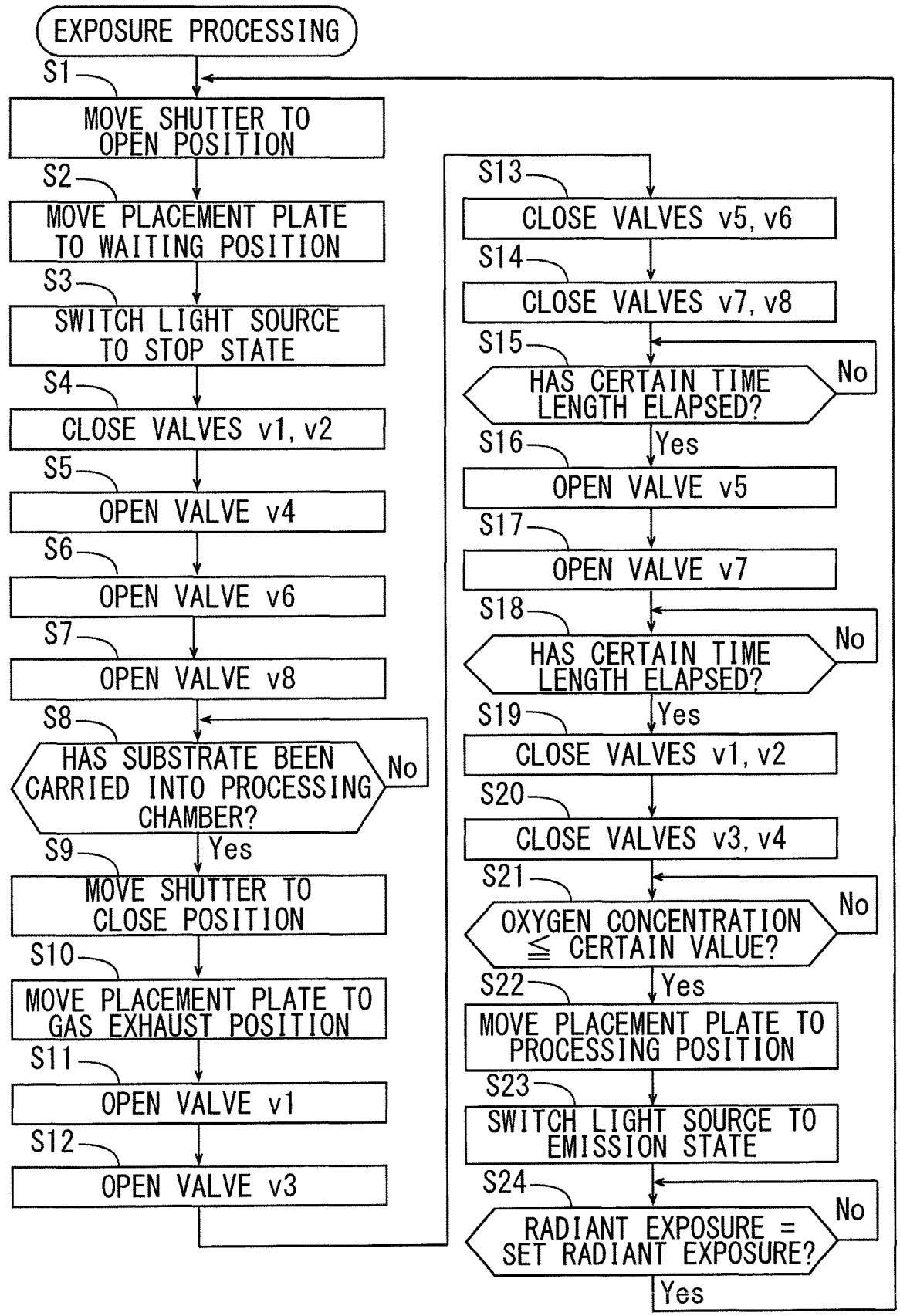
FIG. 11 is a flow chart showing exposure processing performed by the controller of FIG. 3.

FIG. 11 is a flow chart showing the exposure processing performed by the controller 110 of FIG. 3. The exposure processing will be described below with reference to FIGS. 1 and 3. First, the opening closing controller F moves the shutter 131 to the open position (step S1). Thus, the substrate W to be processed can be placed on the upper ends of the plurality of support pins 124 through the transport opening 122. Further, the lifting lowering controller G moves the placement plate 141 to the waiting position (step S2). The light emission controller J switches the light source 153 to the stop state (step S3).

Next, the gas exhaust controller B closes the valves v1, v2 of the gas exhaust section 160 (step S4). The gas exhaust controller C opens the valve v4 of the gas exhaust section 170 (step S5). The gas supply controller D opens the valve v6 of the gas supply section 180 (step S6). The gas supply controller E opens the valve v8 of the gas supply section 190 (step S7). The steps S1 to S7 are processing for allowing the exposure device 100 to be in the initial state, and any one of the steps S1 to S7 may be performed first, or the steps S1 to S7 may be performed simultaneously. In particular, the steps S4 to S7 are preferably simultaneously performed.

"Simultaneous performance" in the present embodiment includes not only the performance of the plurality of processing at completely the same time point but also sequential performance of the plurality of processing in a period of about several seconds or performance of the plurality of processing with delays of about several seconds. This also applies to the following description.

Subsequently, the opening closing controller F determines whether the substrate W is carried into the processing chamber 120 (step S8). Whether the substrate W has been carried into the processing chamber 120 is determined by detection by a photoelectric sensor or the like of whether the holder of the substrate W in the transport device 220 of FIG. 12, described below, has passed through the transport opening 122. When the substrate W has not been carried in, the opening closing controller F waits until the substrate W is carried into the processing chamber 120.

When the substrate W is carried into the processing chamber 120, the opening closing controller F moves the shutter 131 to the close position (step S9). Further, the lifting lowering controller G moves the placement plate 141 to the gas exhaust position (step S10). The gas exhaust controller B opens the valve v1 of the gas exhaust section 160 (step S11). The gas exhaust controller C opens the valve v3 of the gas exhaust section 170 (step S12). The gas supply controller D closes the valves v5, v6 of the gas supply section 180 (step S13). The gas supply controller E closes the valves v7, v8 of the gas supply section 190 (step S14). Any one of the steps S9 to S14 may be performed first, or may be performed simultaneously. In particular, the steps S11 to S14 are preferably simultaneously performed.

Thereafter, the gas supply controller D determines whether a certain period of time has elapsed (step S15). In the case where the certain period of time has not elapsed, the gas supply controller D waits until the certain period of time has elapsed. When the certain period of time has elapsed, the gas supply controller D opens the valve v5 of the gas supply section 180 (step S16). Further, the gas supply controller E opens the valve v7 of the gas supply section 190 (step S17). While any one of the steps S16 and S17 may be performed first, the steps S16 and S17 are performed preferably simultaneously.

Next, the gas exhaust controller B determines whether a certain period of time has elapsed (step S18). In the case where the certain period of time has not elapsed, the gas exhaust controller B waits until the certain period of time has elapsed. In the case where the certain period of time has elapsed, the gas exhaust controller B closes the valves v1, v2 of the gas exhaust section 160 (step S19). Further, the gas exhaust controller C closes the valves v3, v4 of the gas exhaust section 170 (step S20). While any one of the steps S19 and S20 may be performed first, the steps S19 and S20 are performed preferably simultaneously.

Then, the lifting lowering controller G determines whether the oxygen concentration in the gas in the processing chamber 120 is lowered to a value equal to or lower than a certain value (step S21). When the oxygen concentration is not lowered to a value equal to or lower than the certain value, the lifting lowering controller G waits until the oxygen concentration is lowered to a value equal to or lower than the certain value. When the oxygen concentration is lowered to a value equal to or lower than the certain value, the lifting lowering controller G moves the placement plate 141 to the processing position (step S22). Further, the light emission controller J switches the light source 153 to the emission state (step S23). Any one of the steps S22 and S23 may be performed first, or the steps S22 and S23 may be performed simultaneously.

Thereafter, the radiant exposure calculator I determines whether the radiant exposure of the substrate W has reached the set radiant exposure (step S24). When the radiant exposure has not reached the set radiant exposure, the radiant exposure calculator I waits until the radiant exposure reaches the set radiant exposure. When the radiant exposure reaches the set radiant exposure, the radiant exposure calculator I returns to the step S1. Thus, the steps S1 to S24 are repeated. As a result, the exposure processing is sequentially performed on a plurality of substrates W.

(5) Substrate Processing Apparatus

Figure 12:
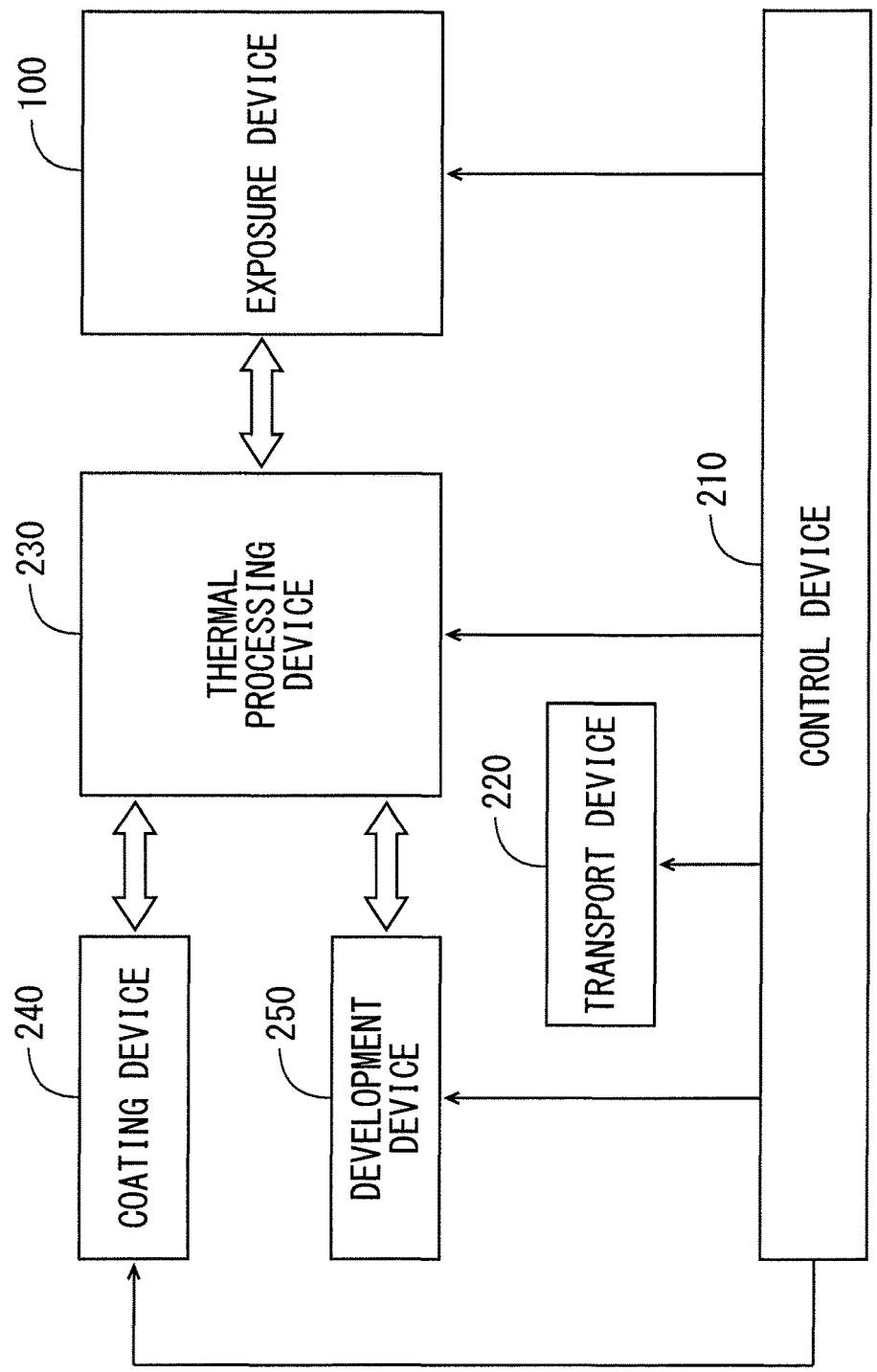
FIG. 12 is a schematic block diagram showing the configuration of the entire substrate processing apparatus including the exposure device of FIG. 1.

FIG. 12 is a schematic block diagram showing the configuration of the entire substrate processing apparatus including the exposure device 100 of FIG. 1. In the substrate processing apparatus 200, described below, processing utilizing Directed Self Assembly (DSA) of a block copolymer is performed. Specifically, a processing liquid including a Directed Self Assembly material is applied onto the surface to be processed of the substrate W. Thereafter, patterns of two types of polymers are formed on the surface to be processed of the substrate W by microphase separation that occurs in the Directed Self Assembly material. One pattern of the two types of polymers is removed by a solvent.

The processing liquid including the Directed Self Assembly material is referred to as a DSA liquid. Further, processing of removing one pattern of the two types of polymers formed on the surface to be processed of the substrate W by the microphase separation is referred to as development processing, and the solvent used for the development processing is referred to as a development liquid.

As shown in FIG. 12, the substrate processing apparatus 200 includes a control device 210, a transport device 220, a thermal processing device 230, a coating device 240 and a development device 250 in addition to the exposure device 100. The control device 210 includes a CPU and a memory, or a microcomputer, for example, and controls operations of the transport device 220, the thermal processing device 230, the coating device 240 and the development device 250. Further, the control device 210 supplies instructions for controlling operations of the closing section 130, the lifter-lowerer 140, the light emitter 150, the gas exhaust sections 160, 170 and the gas supply sections 180, 190 of the exposure device 100 of FIG. 1 to the controller 110.

The transport device 220 transports the substrate W among the exposure device 100, the thermal processing device 230, the coating device 240 and the development device 250 while holding the substrate W to be processed. The thermal processing device 230 performs the thermal processing on the substrate W before the coating processing by the coating device 240, after the coating processing by the coating device 240, before the development processing by the development device 250 or after the development processing by the development device 250.

The coating device 240 supplies the DSA liquid to the surface to be processed of the substrate W, thereby performing the coating processing of a film. In the present embodiment, the block copolymer constituted by the two types of polymers is used as the DSA liquid. Combinations of the two types of the polymers include Polystyrene-Polymethyl Methacrylate (PS-PMMA), Polystyrene-Polydimethylsiloxane (PS-PDMS), Polystyrene-Polyferrocenyl Dimethylsilane (PS-PFS), Polystyrene-Polyethylene Oxide (PS-PEO), Polystyrene-Polyvinyl Pyridine (PS-PVP), Polystyrene-Polyhydroxystyrene (PS-PHOST) or Polymethyl Methacrylate-Polymethacrylate Polyhedral Oligomeric Silsesquioxane (PMMA-PMAPOSS), for example.

The development device 250 supplies the development liquid to the surface to be processed of the substrate W, thereby developing the film. Further, the solvent of the development liquid includes Toluene, Heptane, Acetone, Propylene Glycol Monomethyl Ether Acetate (PGMEA), Propylene Glycol Monomethylether (PGME), Cyclohexanone, Acetic Acid, Tetrahydrofuran, Isopropyl Alcohol (IPA) or Tetramethylammonium Hydroxide (TMAH), for example.

FIGS. 13A to 13D are schematic diagrams showing one example of processing of the substrate W by the substrate processing apparatus 200 of FIG. 12. In FIGS. 13A to 13D, cross sectional views show states of the substrate W that change every time the processing is performed. In the present example, as shown in FIG. 13A, in the initial state, which is a state before the substrate W is carried into the substrate processing apparatus 200, an underlayer L1 is formed to cover the surface to be processed of the substrate W, and a guide pattern L2 made of a photoresist, for example, is formed on the underlayer L1. Operations of the substrate processing apparatus 200 will be described below with use of FIG. 12 and FIGS. 13A to 13D.

The transport device 220 sequentially transports the substrate W to be processed to the thermal processing device 230 and the coating device 240. In this case, in the thermal processing device 230, a temperature of the substrate W is adjusted to a temperature suitable for formation of a DSA film L3. Further, in the coating device 240, the DSA liquid is supplied to the surface to be processed of the substrate W, and the coating processing is performed. Thus, as shown in FIG. 13B, the DSA film L3 constituted by two types of polymers is formed in a region on the underlayer L1 in which the guide pattern L2 is not formed.

Then, the transport device 220 sequentially transports the substrate W on which the DSA film L3 has been formed to the thermal processing device 230 and the exposure device 100. In this case, the heating processing is performed on the substrate W in the thermal processing device 230, so that microphase separation occurs in the DSA film L3. Thus, as shown in FIG. 13C, a pattern Q1 made of one polymer and a pattern Q2 made of another polymer are formed. In the present example, the line pattern Q1 and the line pattern Q2 are directionally formed to extend along the guide pattern L2.

Thereafter, the substrate W is cooled in the thermal processing device 230. Further, in the exposure device 100, the entire DSA film L3 is irradiated with the vacuum ultraviolet rays for reforming the DSA film L3 after the microphase separation, so that the exposure processing is performed. Thus, one polymer is uncoupled from the other polymer, and the pattern Q1 is separated from the pattern Q2.

Subsequently, the transport device 220 sequentially transports the substrate W after the exposure by the exposure device 100 to the thermal processing device 230 and the development device 250. In this case, the substrate W is cooled in the thermal processing device 230. Further, in the development device 250, the development liquid is supplied onto the DSA film L3 on the substrate W, and the development processing is performed. Thus, as shown in FIG. 13D, the pattern Q1 is removed, and the pattern Q2 remains on the substrate W in the end. Finally, the transport device 220 collects the substrate W after the development processing from the development device 250.

(6) Effects

In the exposure device 100 according to the present embodiment, the supply of the inert gas into the processing chamber 120 is started after the certain period of time has elapsed since the exhaust of gas in the processing chamber 120 is started. In this case, the oxygen in the processing chamber 120 is exhausted to the outside of the processing chamber 120 together with another gas before the supply of the inert gas. Thus, the pressure in the processing chamber 120 is lowered, and the amount of oxygen is reduced. Thereafter, the inert gas is supplied into the processing chamber 120, and a small amount of oxygen remaining in the processing chamber 120 is exhausted to the outside of the processing chamber 120 together with the inert gas. Therefore, the oxygen concentration in the gas in the processing chamber 120 is lowered in a short period of time after the substrate W is carried into the processing chamber 120. Therefore, the exposure of the substrate W can start in a short period of time since the substrate W is carried in. As a result, efficiency of the exposure processing of the substrate W can be improved.

Further, after the certain period of time has elapsed since the supply of the inert gas into the processing chamber 120 is started, the exhaust of the gas in the processing chamber 120 is stopped. In this case, with the exhaust of the gas in the processing chamber 120 stopped, the inert gas is further supplied into the processing chamber 120. Thus, the oxygen concentration in the gas in the processing chamber 120 is further lowered, and generation of ozone can be more sufficiently prevented.

Further, in the exposure device 100 according to the present embodiment, the pressure in the processing chamber 120 changes due to the exhaust of the gas in the processing chamber 120 and the supply of the inert gas in the processing chamber 120. In particular, before the supply of the inert gas, the oxygen in the processing chamber 120 is exhausted to the outside of the processing chamber 120 together with another gas. Therefore, the pressure in the processing chamber 120 is lowered, and the amount of oxygen is reduced.

Even in such a case, the pressure in the housing 151 is allowed to match or be close to the pressure in the processing chamber 120. Therefore, a pressure difference between the inside of the processing chamber 120 and the inside of the housing 151 is hardly generated. Therefore, generation of stress in the light-transmitting plate 152 is prevented. In this case, because it is not necessary to increase the thickness of the light-transmitting plate 152, the transmittance of the light-transmitting plate 152 is improved. Thus, efficiency of the exposure processing of the substrate W can be improved.

[2] Second Embodiment

Figure 14:
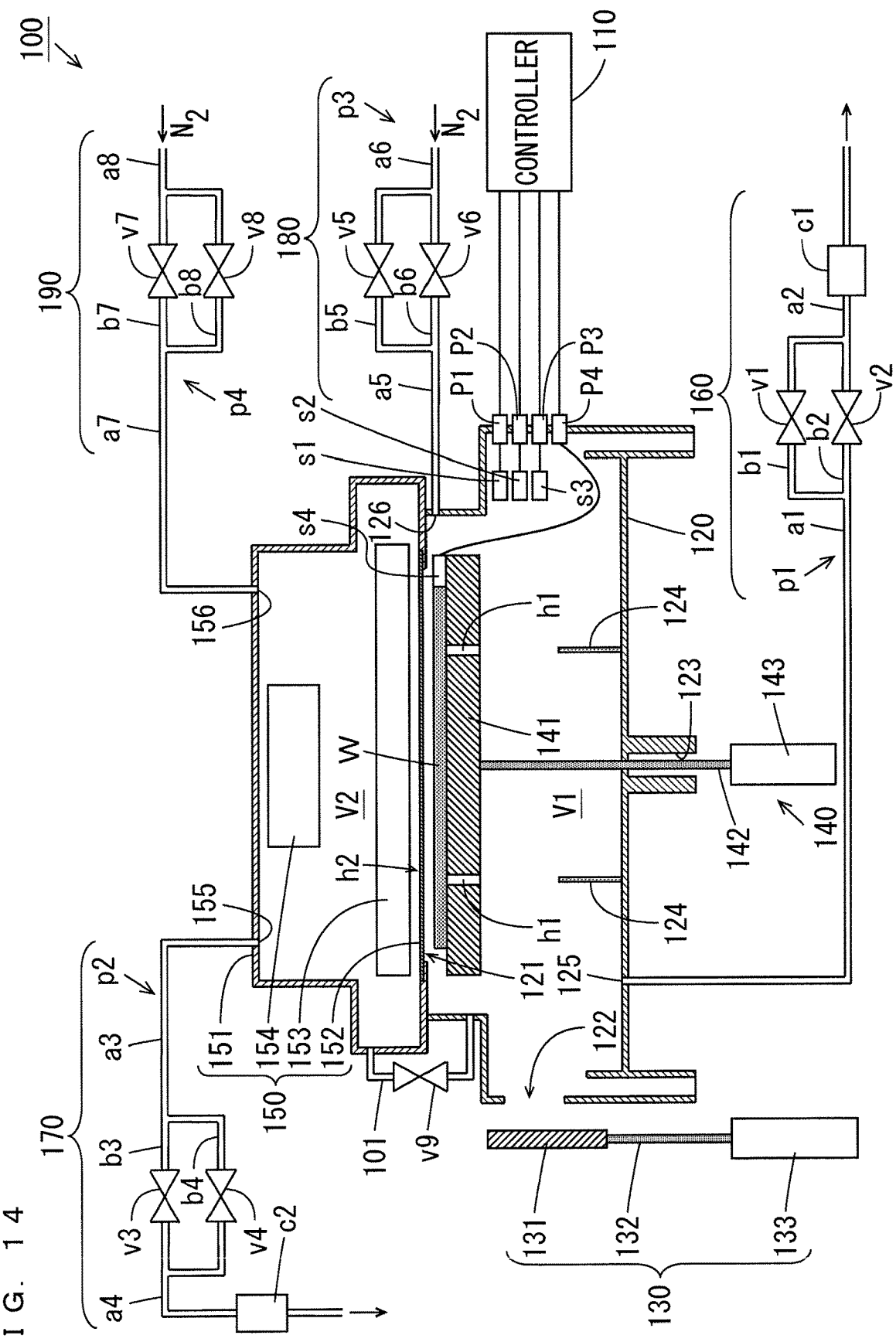
FIG. 14 is a schematic cross sectional view showing a configuration of an exposure device according to a second embodiment of the present invention.

As for an exposure device and a substrate processing apparatus according to the second embodiment, differences from the exposure device and the substrate processing apparatus according to the first embodiment will be described. FIG. 14 is a schematic cross sectional view showing a configuration of the exposure device according to the second embodiment of the present invention. As shown in FIG. 14, the exposure device 100 further includes a connecting pipe 101 that connects a processing chamber 120 to a housing 151. A valve v9 is provided at the connecting pipe 101.

Figure 15:
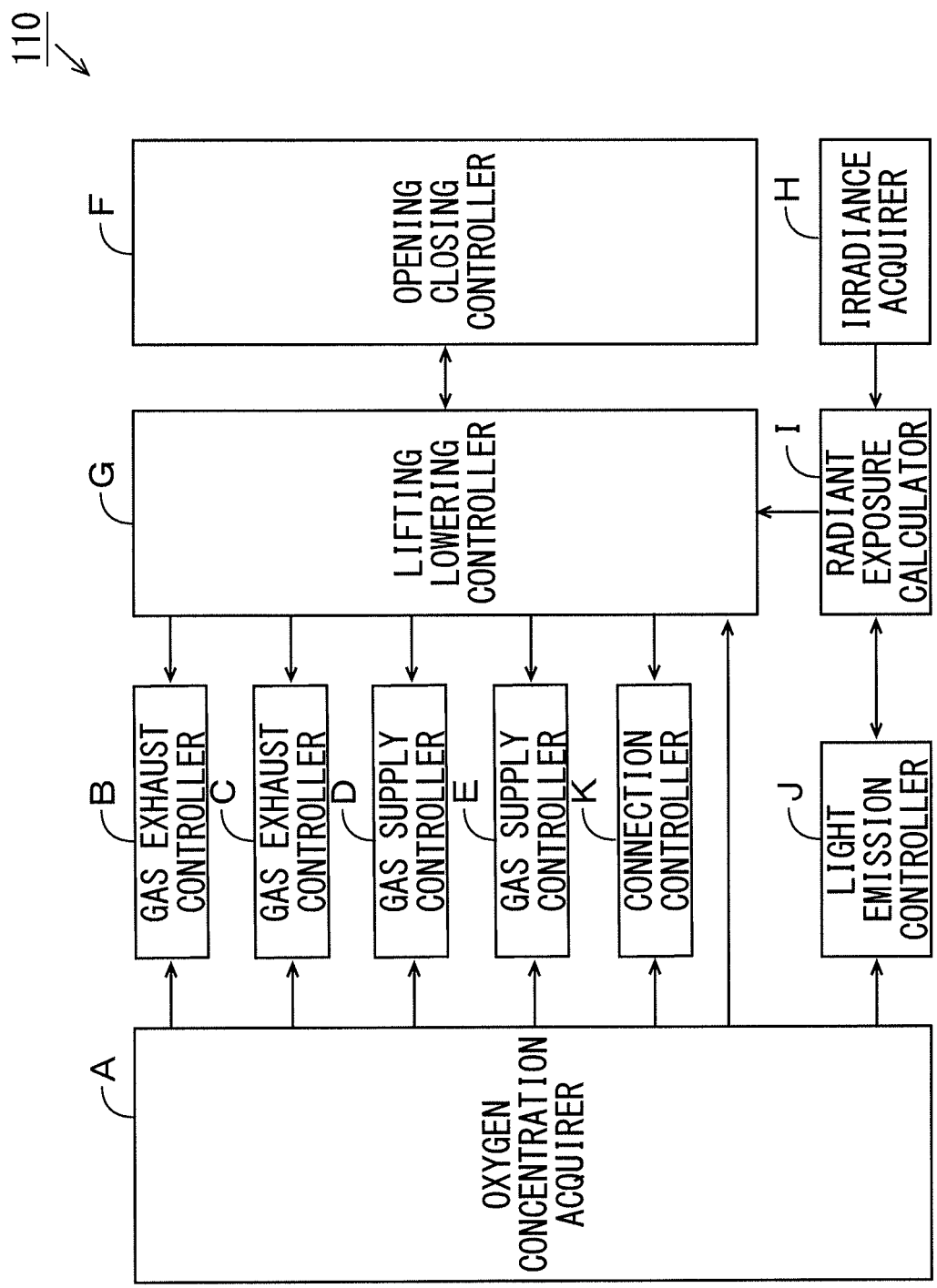
FIG. 15 is a functional block diagram showing a configuration of a controller of FIG. 14.

FIG. 15 is a functional block diagram showing a configuration of a controller 110 of FIG. 14. As shown in FIG. 15, the controller 110 further includes a connection controller K that controls an operation of the valve v9 of FIG. 14. When the valve v9 is opened, an inner space V1 of the processing chamber 120 and an inner space V2 of the housing 151 communicate with each other through the connecting pipe 101, and gas is movable between the inside of the processing chamber 120 and the inside of the housing 151.

Figure 20:
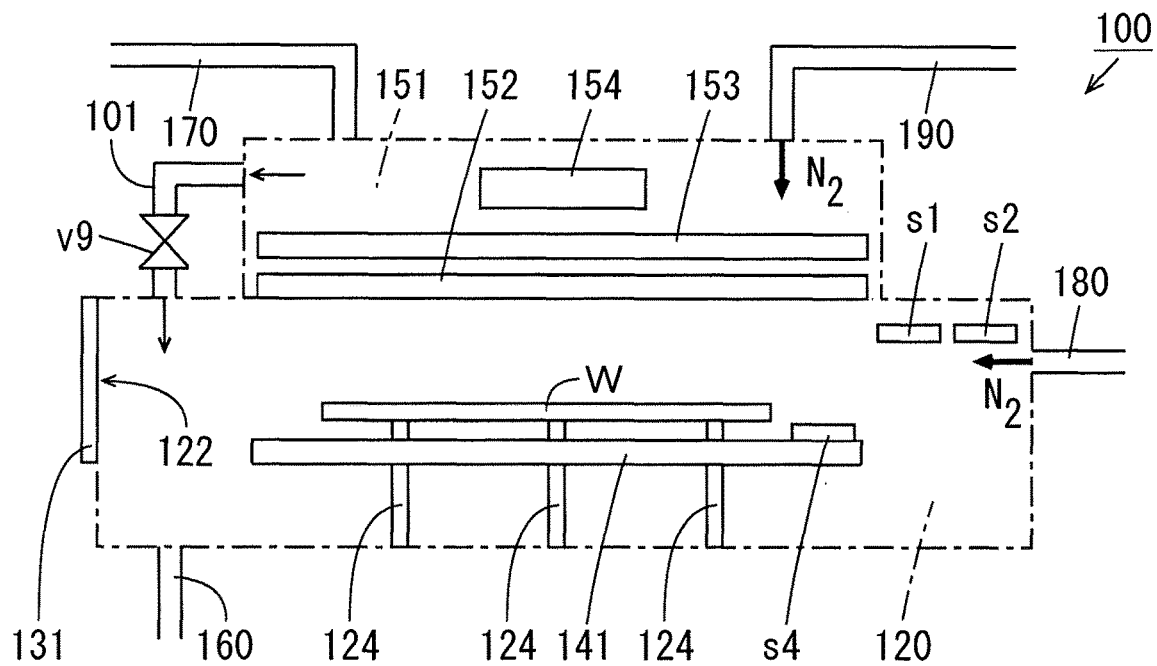
Figure 21:
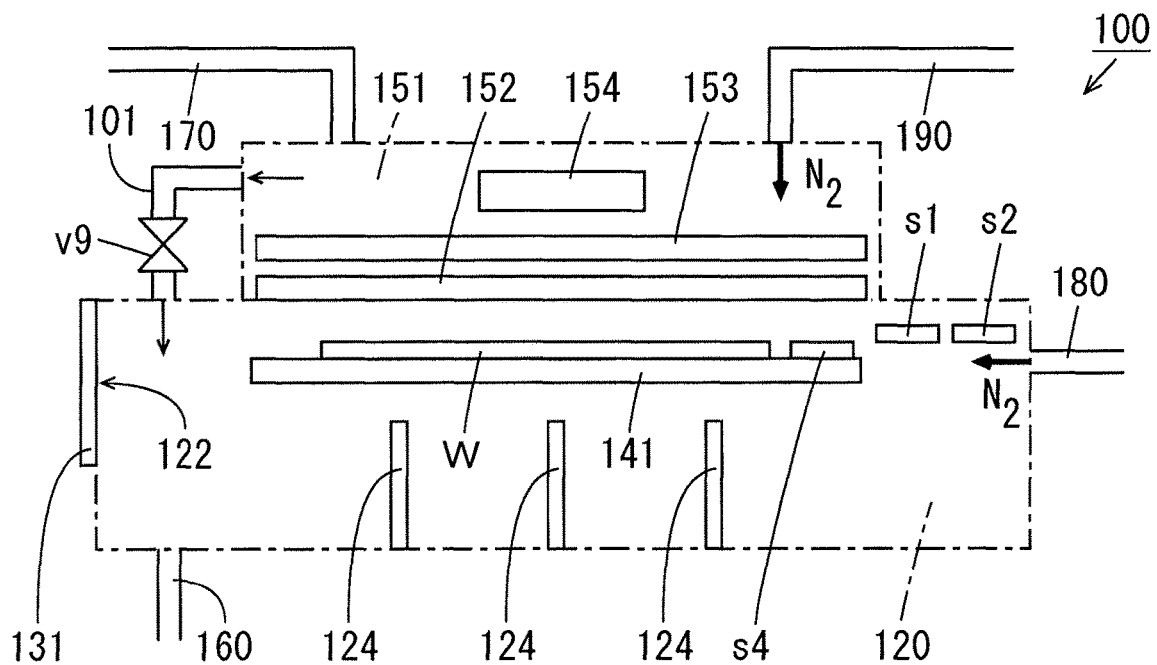
Figure 22:
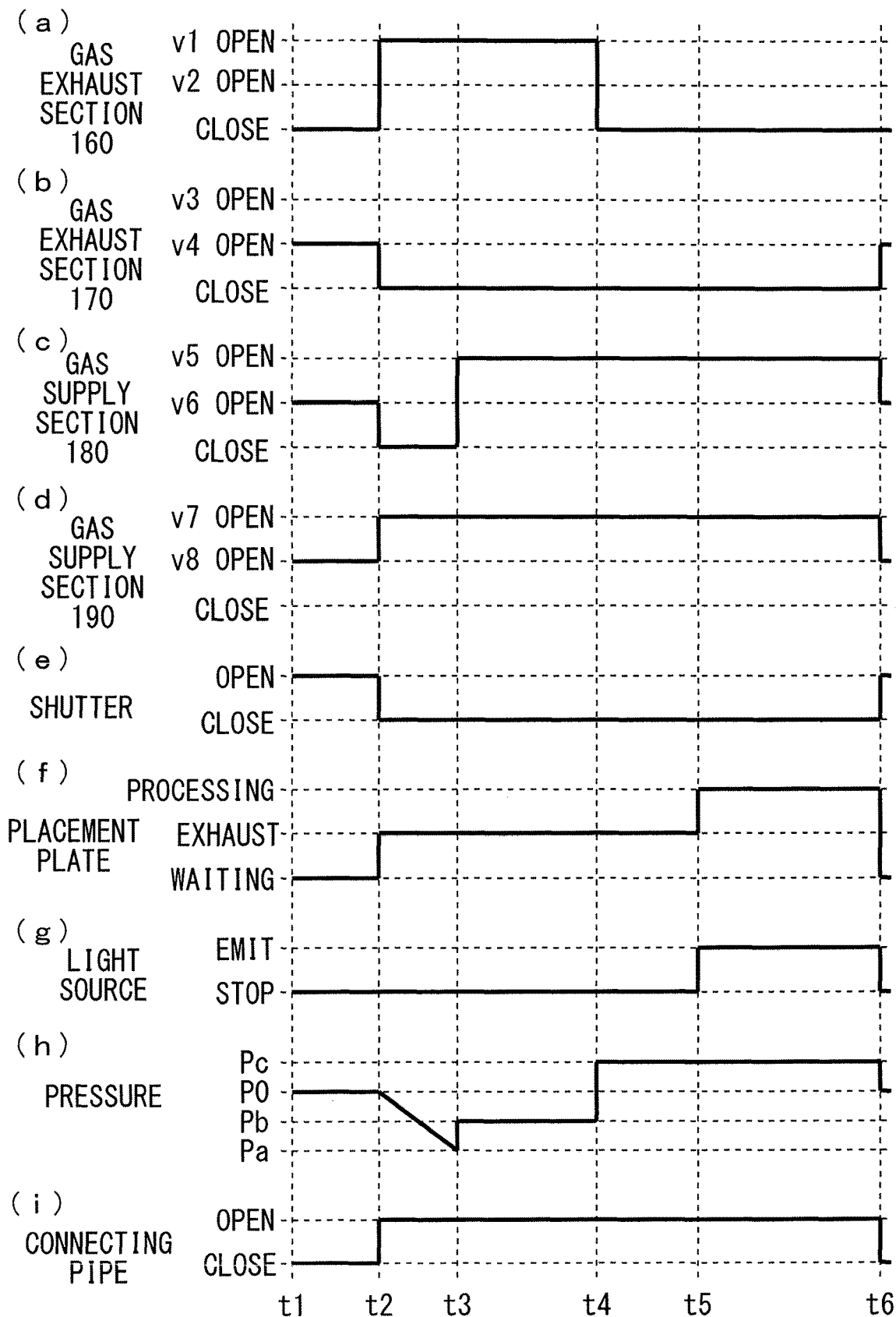
FIG. 22(a) to (i) is a diagram showing timing for controlling by the controller of FIG. 15.

FIGS. 16 to 21 are diagrams for explaining the control of each part of the exposure device 100 by a controller 110 of FIG. 15. FIG. 22 is a diagram showing timing for control by the controller 110 of FIG. 15. FIG. 22(i) shows the timing for switching the operation of the valve v9 in the connecting pipe 101. Hereinafter, the exposure processing by the controller 110 in the present embodiment will be described below with reference to FIGS. 16 to 22.

The timing for controlling each of a gas exhaust section 160, a gas supply section 180, a shutter 131, a placement plate 141 and a light source 153 of FIG. 22 is similar to the timing for controlling each of the gas exhaust section 160, the gas supply section 180, the shutter 131, the placement plate 141 and the light source 153 of FIG. 10. Further, the change of the pressure in the processing chamber 120 of FIG. 22 is similar to the change of the pressure in the processing chamber 120 of FIG. 10. On the other hand, the timing for controlling a gas exhaust section 170 and a gas supply section 190 of FIG. 22 is different from the timing for controlling the gas exhaust section 170 and the gas supply section 190 of FIG. 10.

Figure 16:
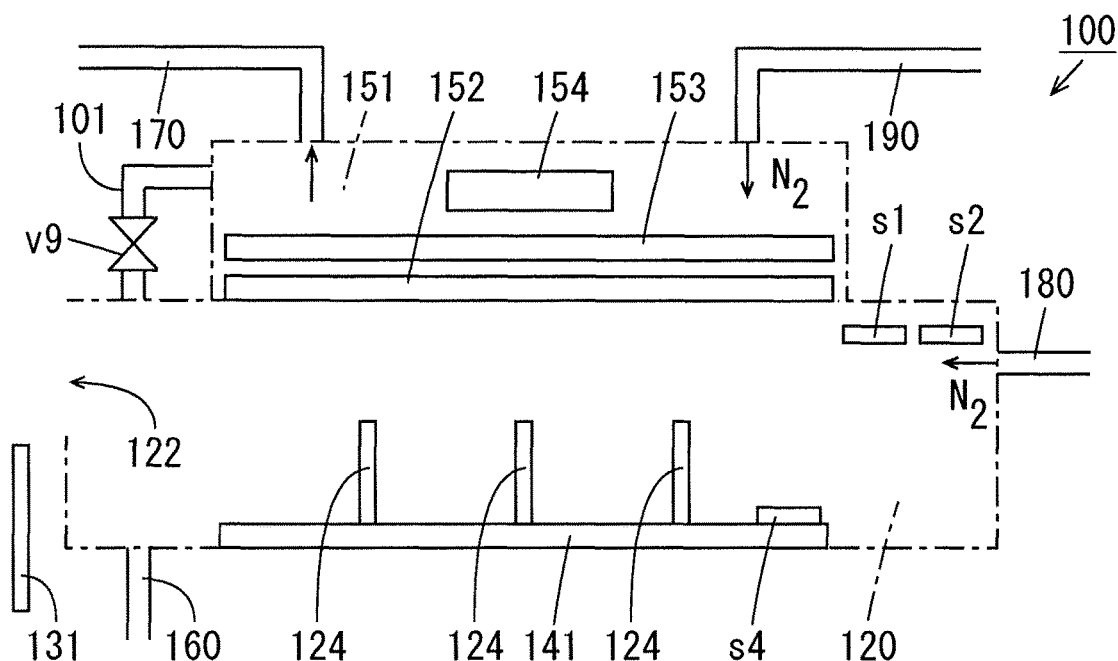
FIGS. 16 to 21 are diagrams for explaining the control of each part of the exposure device by the controller of FIG. 15.

As shown in FIG. 16, the shutter 131 is located at an open position, the placement plate 141 is located at a waiting position, and the light source 153 is located at a stop position at a time point t1 as an initial state. Further, valves v1, v2 of the gas exhaust section 160 are closed, a valve v6 of the gas supply section 180 is opened, a valve v4 of the gas exhaust section 170 is opened, a valve v8 of the gas supply section 190 is opened, and the valve v9 of the connecting pipe 101 is closed.

In this case, although a small amount of an inert gas is supplied into the processing chamber 120 by the gas supply section 180, because the transport opening 122 is opened, the pressure in the processing chamber 120 is maintained at the atmospheric pressure P0, and the oxygen concentration in the gas in the processing chamber 120 is equal to the oxygen concentration in the atmosphere. Further, a small amount of the inert gas is supplied into the housing 151 by the gas supply section 190, and a small amount of gas in the housing 151 is exhausted by the gas exhaust section 170. Therefore, the pressure inside of the housing 151 is maintained at the atmospheric pressure P0, and the inert gas in the housing 151 is maintained. In this state, because the valve v9 is closed, oxygen is easily prevented from flowing into the housing 151 through the processing chamber 120.

Figure 17:
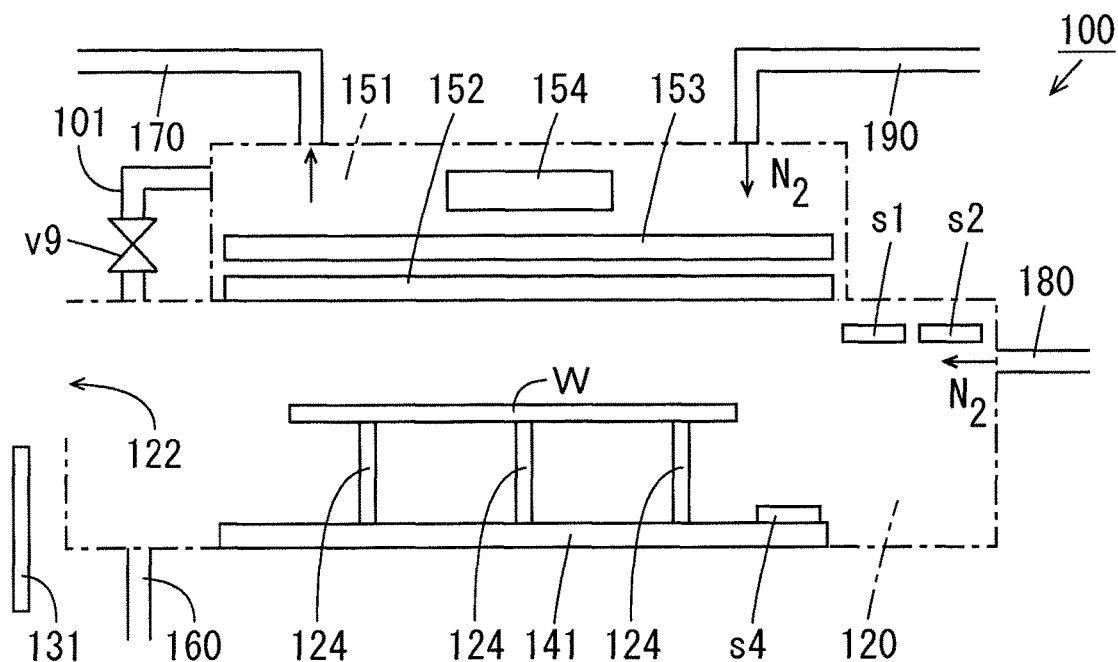
Figure 18:
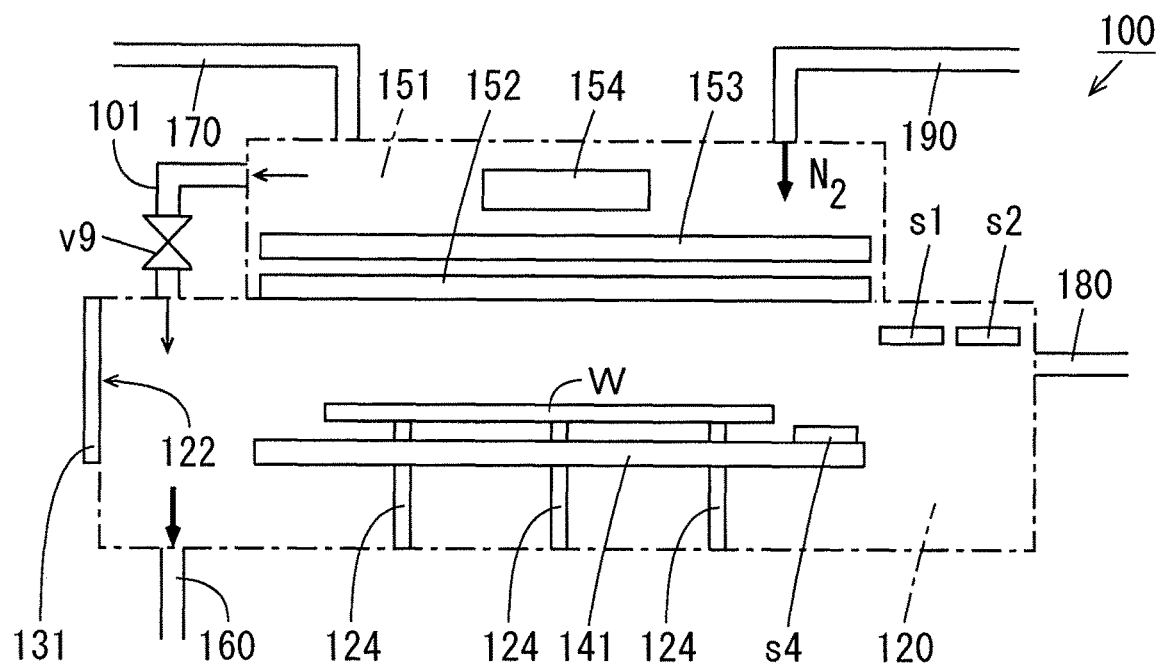

Then, as shown in FIG. 17, the substrate W is placed on upper ends of a plurality of support pins 124 by a transport device 220 of FIG. 12. Thereafter, at a time point t2, as shown in FIG. 18, the shutter 131 is moved to the close position, and the placement plate 141 is moved to the gas exhaust position. Further, the valve v1 of the gas exhaust section 160 is opened, the valves v5, v6 of the gas supply section 180 are closed, the valves v3, v4 of the gas exhaust section 170 are closed, the valve v7 of the gas supply section 190 is opened, and the valve v9 of the connecting pipe 101 is opened.

In this case, with the transport opening 122 closed and with the supply of the inert gas from the gas supply section 180 into the processing chamber 120 stopped, a large amount of gas in the processing chamber 120 is exhausted by the gas exhaust section 160. Therefore, the oxygen in the processing chamber 120 is exhausted to the outside of the processing chamber 120 together with another gas, so that an amount of oxygen is reduced in a short period of time. Further, the pressure in the processing chamber 120 and the pressure in the housing 151 are lowered to a value Pa that is lower than the atmospheric pressure P0.

Here, the inner space of the housing 151 and the inner space of the processing chamber 120 communicate with each other through the connecting pipe 101, and the pressure in the processing chamber 120 and the pressure in the housing 151 are maintained equal. Further, because a large amount of the inert gas is supplied into the housing 151 with the exhaust of the gas in the housing 151 by the gas exhaust section 170 stopped, the gas in the housing 151 is moved into the processing chamber 120. Gas does not move (does not flow backward) from the processing chamber 120 into the housing 151. Thus, the gas including oxygen is prevented from flowing into the housing 151.

Figure 19:
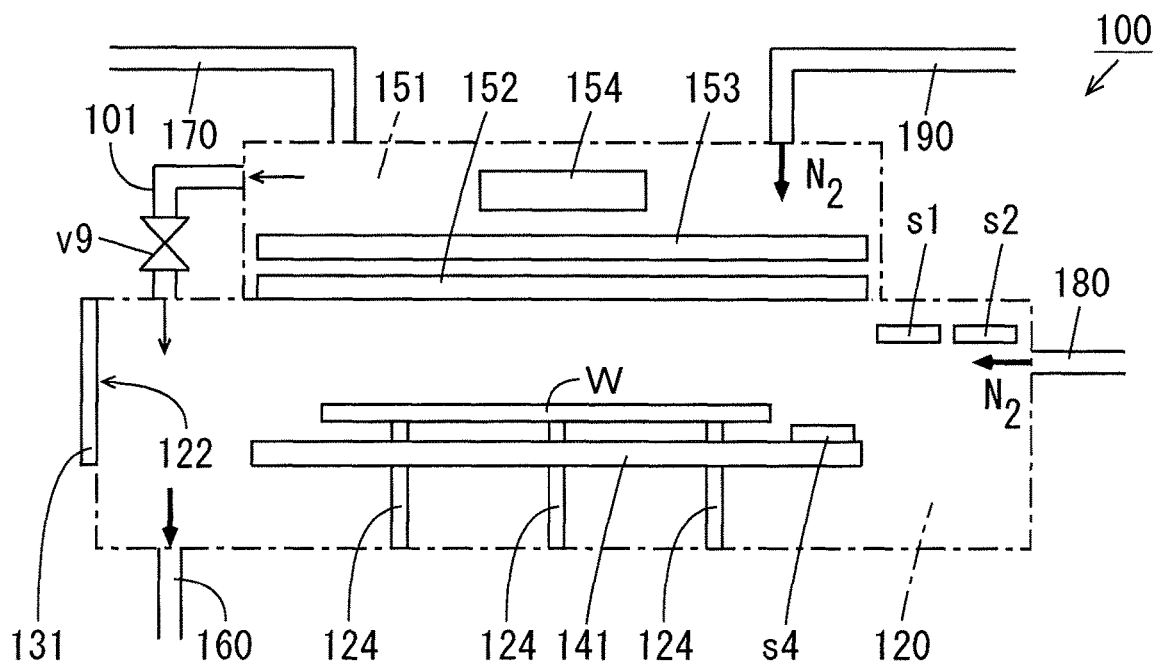

After a certain period of time has elapsed, the valve v5 of the gas supply section 180 is opened at a time point t3 as shown in FIG. 19. In this case, a large amount of the inert gas is supplied into the processing chamber 120 by the gas supply section 180. Therefore, a small amount of oxygen remaining in the processing chamber 120 is exhausted to the outside of the processing chamber 120 together with the inert gas. Therefore, the oxygen concentration in the gas in the processing chamber 120 is lowered in a short period of time. Further, the pressure in the processing chamber 120 and the pressure in the housing 151 increase to a value Pb that is higher than the value Pa and lower than the atmospheric pressure P0.

Subsequently, the valves v1, v2 of the gas exhaust section 160 are closed at a time point t4 as shown in FIG. 20. In this case, a larger amount of the inert gas is supplied into the processing chamber 120 by the gas supply section 180. Thus, the pressure in the processing chamber 120 and the pressure in the housing 151 increase to a value Pc higher than the atmospheric pressure P0, and the oxygen concentration in the gas in the processing chamber 120 continues to be lowered.

At a time point t5, the oxygen concentration in the gas in the processing chamber 120 is lowered to a value equal to or lower than a certain value (100 ppm, for example). Thus, as shown in FIG. 21, the placement plate 141 is moved to the processing position, and the light source 153 is in the emission state. In this case, the substrate W is received from the plurality of support pins 124 to be transferred to the placement plate 141 and is in close proximity to the light-transmitting plate 152. In this state, the substrate W is irradiated with the vacuum ultraviolet rays through the light-transmitting plate 152 by the light source 153, and the DSA film formed on the surface to be processed is exposed.

At a time point t6, radiant exposure of the vacuum ultraviolet rays with which the substrate W is irradiated reaches the set radiant exposure. Thus, similarly to the initial state of FIG. 17, the light source 153 is in the stop state, the placement plate 141 is moved to the waiting position, and the shutter 131 is moved to the open position. Further, the valve v6 of the gas supply section 180 is opened, the valve v4 of the gas exhaust section 170 is opened, the valve v8 of the gas supply section 190 is opened, and the valve v9 of the connecting pipe 101 is closed.

In this case, the pressure inside of the processing chamber 120 and the pressure inside of the housing 151 are maintained at the atmospheric pressure P0 while the connection between the inner space of the housing 151 and the inner space of the processing chamber 120 is shut off. The oxygen concentration in the gas in the processing chamber 120 is equal to the oxygen concentration in the air. Further, the substrate W is received from the placement plate 141 to be transferred to the plurality of support pins 124 after exposure. In the present example, the substrate W is carried from the upper ends of the plurality of support pins 124 to the outside of the processing chamber 120 by the transport device 220 of FIG. 12. With this configuration, the pressure in the processing chamber 120 and the pressure in the housing 151 can be allowed to match with simpler control, or a pressure difference between the inside of the processing chamber 120 and the inside of the housing 151 can be reduced to be smaller than a certain value with simpler control.

Figure 23:
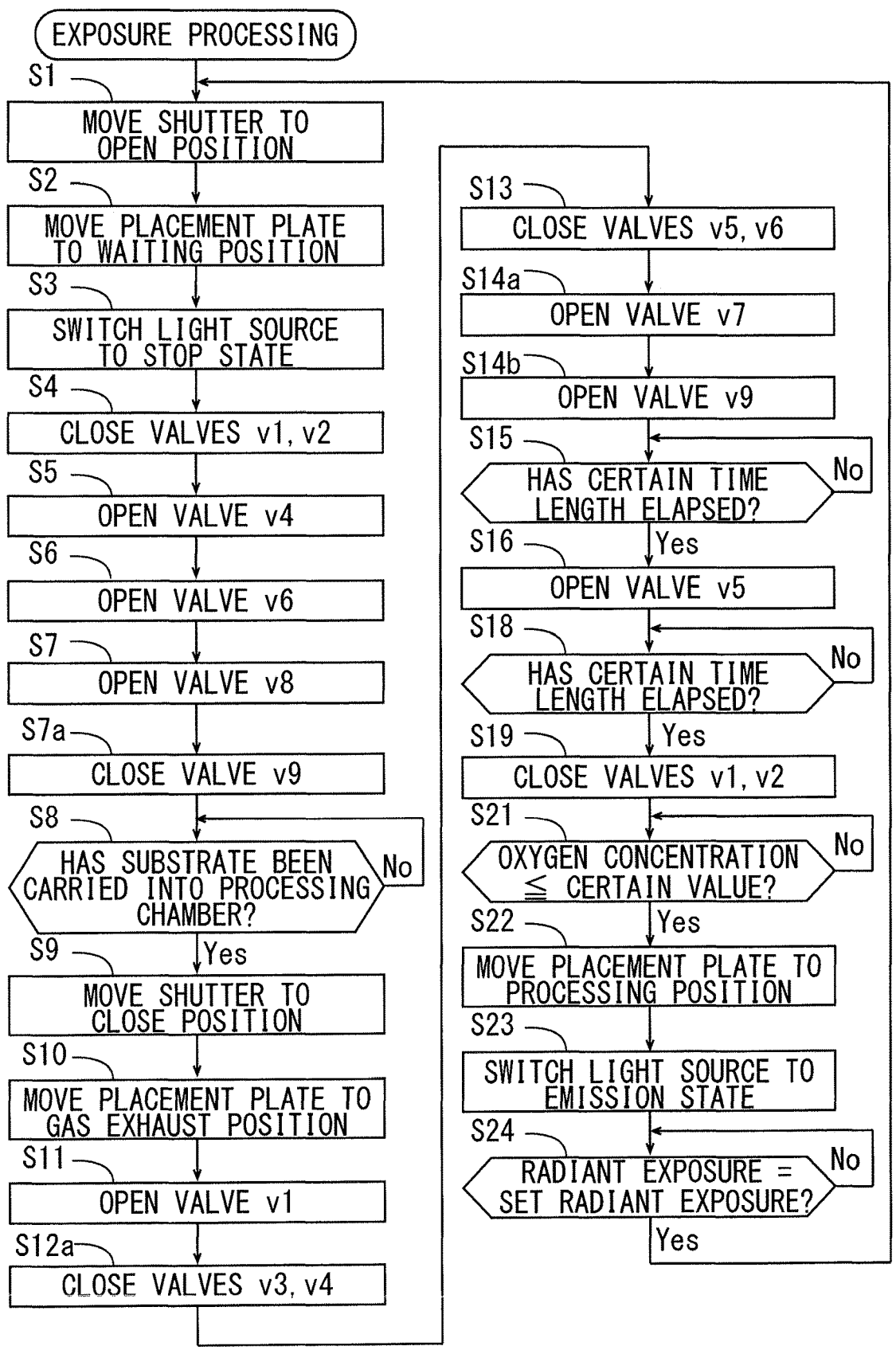
FIG. 23 is a flow chart showing the exposure processing performed by the controller of FIG. 15.

FIG. 23 is a flow chart showing the exposure processing performed by the controller 110 of FIG. 15. The exposure processing of FIG. 23 is different from the exposure processing of FIG. 11 in the following points. The step S7a is performed between the steps S7 and S8. The step S12a is performed instead of the step S12. The step S14a is performed instead of the step S14. The step S14b is performed between the steps S14a and S15. The steps S17 and S20 are not performed.

In the step S7a, the connection controller K closes the valve v9 of the connecting pipe 101. In the step S12a, the gas exhaust controller C closes the valves v3, v4. In the step S14a, the gas supply controller E opens the valve v7 of the gas supply section 190. In the step S14b, the connection controller K opens the valve v9 of the connecting pipe 101.

The steps S1 to S7 and the step S7a are processing for allowing the exposure device 100 to be in the initial state. Any one of the steps S1 to S7 and the step S7a may be performed first, or the steps S1 to S7 and the step S7a may be performed simultaneously. In particular, the steps S4 to S7 and the step S7a are performed preferably simultaneously. Any one of the steps S9, S10, S11, S12a, S13, S14a and S14b may be performed first, or the steps S9, S10, S11, S12a, S13, S14a and S14b may be performed simultaneously. In particular, the steps S11, S12a, S13, S14a and S14b are performed preferably simultaneously.

[3] Other Embodiments (1) While the DSA liquid is used as the processing liquid in the above-mentioned embodiment, the present invention is not limited to this. Another processing liquid different from the DSA liquid may be used.

(2) In the above-mentioned embodiment, the emission surface of the vacuum ultraviolet rays is larger than the surface to be processed of the substrate W, and the entire surface of the substrate W is exposed. However, the present invention is not limited to this. The emission surface of the vacuum ultraviolet rays may be smaller than the surface to be processed of the substrate W, and planar vacuum ultraviolet rays do not have to be emitted. In this case, the emission surface of the vacuum ultraviolet rays and the surface to be processed of the substrate W are moved relative to each other, whereby the entire surface to be processed of the substrate W is irradiated with the vacuum ultraviolet rays.

(3) In the above-mentioned embodiment, the exposure of the substrate W is started when the oxygen concentration in the gas in the processing chamber 120 is lowered to 100 ppm. However, the present invention is not limited to this. The exposure of the substrate W may be started when the oxygen concentration in the gas in the processing chamber 120 is lowered to the concentration higher than 100 ppm (1%, for example).

(4) In the above-mentioned embodiment, the gas exhaust port 125 is formed at a position farther downward than the gas exhaust position, and the gas supply port 126 is formed at a position farther upward than the gas exhaust position. However, the present invention is not limited to this. The gas exhaust port 125 may be formed at a position farther upward than the gas exhaust position, and the gas supply port 126 may be formed at a position farther downward than the gas exhaust position. Alternatively, both of the gas exhaust port 125 and the gas supply port 126 may be formed at positions farther upward than the gas exhaust position, or both of the gas exhaust port 125 and the gas supply port 126 may be formed at positions farther downward than the gas exhaust position. Therefore, the gas exhaust port 125 and the gas supply port 126 do not have to be formed with the gas exhaust position located therebetween.

(5) In the above-mentioned embodiment, the placement plate 141 is moved to the gas exhaust position when the gas in the processing chamber 120 is exhausted. However, the present invention is not limited to this. When a small clearance is not formed around the placement plate 141 that is located at the waiting position, and oxygen is unlikely to be stagnant, the placement plate 141 does not have to be moved to the gas exhaust position when the gas in the processing chamber 120 is exhausted.

(6) While the pressure in the housing 151 is controlled to match or be close to the pressure in the processing chamber 120 in the above-mentioned embodiment, the present invention is not limited to this. When the light-transmitting plate 152 has sufficient strength, the pressure in the housing 151 does not have to be controlled to match or be close to the pressure in the processing chamber 120.

(7) While the exhaust of the gas in the processing chamber 120 is started earlier than the supply of the inert gas into the processing chamber 120 in the above-mentioned embodiment, the present invention is not limited to this. When the oxygen in the processing chamber 120 can be sufficiently exhausted in a short period of time, the exhaust of the gas in the processing chamber 120 does not have to be started before the supply of the inert gas into the processing chamber 120. Therefore, the supply of the inert gas into the processing chamber 120 and the exhaust of the gas in the processing chamber 120 may be simultaneously started.

[4] Correspondences Between Constituent Elements in Claims and Parts in Preferred Embodiments In the following paragraphs, non-limiting examples of correspondences between various elements recited in the claims below and those described above with respect to various preferred embodiments of the present invention are explained. As each of various elements recited in the claims, various other elements having configurations or functions described in the claims can be also used.

In the above-mentioned embodiment, the light emitter 150 is an example of a light emitter, the placement plate 141 is an example of a platform, the gas exhaust sections 160, 170 are respectively examples of first and second gas exhaust sections, and the gas supply sections 180, 190 are respectively examples of first and second gas supply sections. The gas supply controllers D, E are respectively examples of first and second gas supply controllers, the driving device 143 is an example of a driver, the gas exhaust controller B is an example of a gas exhaust controller, and the support pin 124 is an example of a support member.

The light-transmitting plate 152 is an example of a window member, the connecting pipe 101 is an example of a connecter, the coating device 240 is an example of a coater, the thermal processing device 230 is an example of a thermal processor, the development device 250 is an example of a developer, and the substrate processing apparatus 200 is an example of a substrate processing apparatus. The transport opening 122 is an example of an opening, the valve v9 is an example of a valve, the gas exhaust controller B is an example of a gas exhaust controller, or the gas exhaust controllers B, C are respectively examples of first and second gas exhaust controllers.

In the first embodiment, the gas exhaust section 170, the gas supply section 190 and the gas supply controller E are examples of a pressure controller, or the gas exhaust section 170, the gas supply section 190, the gas exhaust controller C and the gas supply controller E are examples of a pressure controller. In the second embodiment, the connecting pipe 101 and the gas supply section 190 are examples of a pressure controller, or the connecting pipe 101, the gas supply section 190, the valve v9 and the connection controller K are examples of a pressure controller.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. An exposure device comprising:
   a processing chamber that stores a substrate;
   a platform on which the substrate is placed in the processing chamber;
   a first gas exhaust section for exhausting gas in the processing chamber;
   a first gas supply section for supplying an inert gas into the processing chamber;

a light emitter that is arranged in an upper portion of the chamber and emits vacuum ultraviolet rays;
a first gas supply controller that opens the first gas exhaust section, and controls the first gas supply section such that after a predetermined first time length has elapsed since exhaust of the gas in the processing chamber is started by the first gas exhaust section, the first gas supply section is opened while the first gas exhaust section remains opened, and while supply of the inert gas into the processing chamber is started;
a light emission controller that controls the light emitter such that the substrate is exposed by irradiation of the substrate in the processing chamber with the vacuum ultraviolet rays with an oxygen concentration in the gas in the processing chamber lowered to a predetermined concentration; and
a driver that moves the platform between a first position and a second position such that the platform is located at the first position in the processing chamber when the substrate is carried into or carried out from the processing chamber, and moves the platform between the first position and the second position such that the platform is located at the second position that is closer to the light emitter than the first position when the substrate is irradiated with the vacuum ultraviolet rays by the light emitter,
wherein the light emitter is arranged above the platform and emits the vacuum ultraviolet rays downwardly,
the second position is below the light emitter, and the first position is below the second position,
the light emitter overlaps with the platform in plan view,
the first position and the second position overlap with the light emitter in plan view, and
the driver lifts and lowers the platform between the first position and the second position.

2. The exposure device according to claim 1, further comprising a gas exhaust controller that controls the first gas exhaust section such that the exhaust of gas in the processing chamber is stopped after a predetermined second time length has elapsed since the supply of the inert gas into the processing chamber is started by the first gas supply section.

3. The exposure device according to claim 1, wherein
the driver moves the platform such that the platform is located at a third position that is farther upward than the first position and farther downward than the second position when the gas in the processing chamber is exhausted by the first exhaust section.

4. The exposure device according to claim 3, wherein
the first gas exhaust section has a gas exhaust port through which gas is exhausted in the processing chamber,
the first gas supply section has a gas supply port through which the inert gas is supplied in the processing chamber,
the gas exhaust port is arranged at one of a position farther upward than the third position and a position farther downward than the third position, and
the gas supply port is arranged at another one of the position farther upward than the third position and the position farther downward than the third position.

5. The exposure device according to claim 1, further comprising a plurality of support members that extend in an up-and-down direction in the processing chamber, wherein
upper ends of the plurality of support members are higher than the first position and lower than the second position,
the platform has a plurality of through holes through which the plurality of support members can pass, and the plurality of support members pass through the plurality of through holes of the platform when the platform is located at the first position.

6. The exposure device according to claim 1, further comprising a pressure controller that controls pressure in the light emitter such that the pressure in the light emitter matches the pressure in the processing chamber, wherein
the light emitter has a light-transmitting window member, and emits the vacuum ultraviolet rays to the substrate in the processing chamber through the window member.

7. The exposure device according to claim 6, wherein
the pressure controller includes
a second gas exhaust section for exhausting gas in the light emitter,
a second gas supply section for supplying an inert gas into the light emitter, and
a second gas supply controller that controls the second gas supply section such that supply of the inert gas into the light emitter is started after the first time length has elapsed since exhaust of the gas in the light emitter is started by the second gas exhaust section.

8. The exposure device according to claim 6, wherein
the pressure controller includes
a connector that connects an inner space of the processing chamber to an inner space of the light emitter, and
a second gas supply section that supplies an inert gas into the light emitter.

9. A substrate processing apparatus comprising:
a coater that forms a film on a substrate by applying a processing liquid to the substrate;
a thermal processor that thermally processes the substrate on which the film is formed by the coater;
the exposure device according to claim 1 that exposes the substrate that has been thermally processed by the thermal processor; and
a developer that develops the film of the substrate by supplying a solvent to the substrate that has been exposed by the exposure device.

10. An exposure method including:
moving a platform to a first position in a processing chamber by a driver in a direction in which vacuum ultraviolet rays are emitted;
carrying a substrate into the processing chamber and placing the substrate on the platform;
starting exhaust of gas in the processing chamber by a first gas exhaust section;
opening the first gas exhaust section, and after a predetermined first time length has elapsed since the exhaust of the gas in the processing chamber is started by the first gas exhaust section, opening a first gas supply section while the first gas exhaust section remains opened, and while starting supply of an inert gas into the processing chamber by the first gas supply section;
moving the platform to a second position farther upward than the first position and downward than a light emitter by the driver in a direction in which the vacuum ultraviolet rays are emitted with an oxygen concentration in the gas in the processing chamber lowered to a predetermined concentration;
exposing the substrate by irradiating the substrate in the downward processing chamber with the vacuum ultraviolet rays by the light emitter arranged above the platform;
moving the platform between the first position and the second position by the driver;
carrying out the substrate from the processing chamber, wherein the light emitter overlaps with the platform in plan view, and
the first position and the second position overlap with the light emitter in plan view.

11. A substrate processing method including:
forming a film on a substrate by applying a processing liquid to a surface to be processed of the substrate by a coater;
thermally processing the substrate on which the film is formed by the coater by a thermal processor;
the exposure method according to claim 10 for exposing the substrate that has been thermally processed by the thermal processor by an exposure device; and
developing the film of the substrate by supplying a solvent by a developer to the surface to be processed of the substrate that has been exposed by the exposure device.

12. An exposure device comprising:
a processing chamber that stores a substrate;
a light emitter that has a light-transmitting window member, and emits vacuum ultraviolet rays to the substrate in the processing chamber through the window member;
a first gas exhaust section for exhausting gas in the processing chamber;
a first gas supply section for supplying an inert gas into the processing chamber;
a pressure controller that controls pressure in the light emitter such that the pressure in the light emitter matches pressure in the processing chamber;
a light emission controller that controls the light emitter such that the substrate is exposed by irradiance of the substrate in the processing chamber with the vacuum ultraviolet rays with an oxygen concentration in the gas in the processing chamber lowered to a predetermined concentration; and
a first gas supply controller that controls the first gas supply section such that the supply of the inert gas into the processing chamber is started after a predetermined first time length has elapsed since the exhaust of gas in the processing chamber is started by the first gas exhaust section,
wherein the pressure controller includes
a second gas exhaust section for exhausting gas in the light emitter,
a second gas supply section for supplying the inert gas into the light emitter, and
a second gas supply controller that controls the second gas supply section such that the supply of the inert gas into the light emitter is started after the first time length has elapsed since the exhaust of the gas in the light emitter is started by the second gas exhaust section.

13. The exposure device according to claim 12, further comprising a first gas exhaust controller that controls the first gas exhaust section such that exhaust of the gas in the processing chamber is stopped after a predetermined second time length has elapsed since the supply of the inert gas into the processing chamber is started by the first gas supply section, wherein
the pressure controller further includes a second gas exhaust controller that controls the second gas exhaust section such that the exhaust of the gas in the light emitter is stopped after the second time length has elapsed since the supply of the inert gas into the light emitter is started by the second gas supply section.

14. A substrate processing apparatus comprising:
a coater that forms a film on a substrate by applying a processing liquid to the substrate;
a thermal processor that thermally processes the substrate on which the film is formed by the coater;
the exposure device according to claim 12 that exposes the substrate that has been thermally processed by the thermal processor; and
a developer that develops the film of the substrate by supplying a solvent to the substrate that has been exposed by the exposure device.

15. An exposure device comprising:
a processing chamber that stores a substrate;
a light emitter that has a light-transmitting window member, and emits vacuum ultraviolet rays to the substrate in the processing chamber through the window member;
a first gas exhaust section for exhausting gas in the processing chamber;
a first gas supply section for supplying an inert gas into the processing chamber;
a pressure controller that controls pressure in the light emitter such that the pressure in the light emitter matches pressure in the processing chamber; and
a light emission controller that controls the light emitter such that the substrate is exposed by irradiance of the substrate in the processing chamber with the vacuum ultraviolet rays with an oxygen concentration in the gas in the processing chamber lowered to a predetermined concentration,
wherein the pressure controller includes
a connector that connects an inner space of the processing chamber to an inner space of the light emitter, and
a second gas supply section that supplies an inert gas into the light emitter.

16. The exposure device according to claim 15, further comprising a first gas exhaust controller that controls the first gas exhaust section such that exhaust of the gas in the processing chamber is stopped after a predetermined second time length has elapsed since supply of the inert gas into the processing chamber is started by the first gas supply section.

17. The exposure device according to claim 15, wherein the processing chamber has an opening,
the exposure device further includes a closing section that opens the opening when the substrate is carried into or carried out from the processing chamber and closes the opening after the substrate is carried into the processing chamber, and
the pressure controller includes
a valve provided at the connector, and
a connection controller that controls the valve such that the valve is closed when the opening is opened, and controls the valve such that the valve is opened when the opening is closed.

18. A substrate processing apparatus comprising:
a coater that forms a film on a substrate by applying a processing liquid to the substrate;
a thermal processor that thermally processes the substrate on which the film is formed by the coater;
the exposure device according to claim 15 that exposes the substrate that has been thermally processed by the thermal processor; and
a developer that develops the film of the substrate by supplying a solvent to the substrate that has been exposed by the exposure device.

19. An exposure method including:
exhausting gas in a processing chamber in which a substrate is stored by a first gas exhaust section;
supplying an inert gas into the processing chamber by a first gas supply section;

supplying the inert gas into the processing chamber by the first gas supply section after a predetermined first time length has elapsed since the exhaust of the gas in the processing chamber is started by the first gas exhaust section;

exhausting gas in a light emitter having a light-transmitting window member by a second gas exhaust section such that pressure in the light emitter matches pressure in the processing chamber;

supplying the inert gas into the light emitter by a second gas supply section after the first time has elapsed since the exhaust of the gas in the light emitter is started by the second gas exhaust section such that the pressure in the light emitter matches the pressure in the processing chamber; and exposing the substrate by irradiating the substrate in the processing chamber with vacuum ultraviolet rays through the window member by the light emitter with an oxygen concentration in the gas in the processing chamber lowered to a predetermined concentration.

20. A substrate processing method including:

forming a film on a substrate by applying a processing liquid to a surface to be processed of the substrate by a coater;

thermally processing the substrate on which the film is formed by the coater by a thermal processor;

the exposure method according to claim 19 for exposing the substrate that has been thermally processed by the thermal processor by an exposure device; and developing the film of the substrate by supplying a solvent by a developer to the surface to be processed of the substrate that has been exposed by the exposure device.

21. An exposure method including:

exhausting gas in a processing chamber in which a substrate is stored by a first gas exhaust section;

supplying an inert gas into the processing chamber by a first gas supply section;

supplying the inert gas by a second gas supply section into an inner space of a light emitter connected to an inner space of the processing chamber by a connector;

allowing pressure in the light emitter having a light-transmitting window member to match pressure in the processing chamber; and exposing the substrate by irradiating the substrate in the processing chamber with vacuum ultraviolet rays through the window member by the light emitter with an oxygen concentration in the gas in the processing chamber lowered to a predetermined concentration.

22. A substrate processing method including:

forming a film on a substrate by applying a processing liquid to a surface to be processed of the substrate by a coater;

thermally processing the substrate on which the film is formed by the coater by a thermal processor;

the exposure method according to claim 21 for exposing the substrate that has been thermally processed by the thermal processor by an exposure device; and developing the film of the substrate by supplying a solvent by a developer to the surface to be processed of the substrate that has been exposed by the exposure device.

* * * * *